United States Patent
Wu et al.

(10) Patent No.: US 7,307,345 B2
(45) Date of Patent: Dec. 11, 2007

(54) CROSSBAR-ARRAY DESIGNS AND WIRE ADDRESSING METHODS THAT TOLERATE MISALIGNMENT OF ELECTRICAL COMPONENTS AT WIRE OVERLAP POINTS

(75) Inventors: Wei Wu, Mountain View, CA (US); Philip J. Kuekes, Menlo Park, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/264,464

(22) Filed: Nov. 1, 2005

(65) Prior Publication Data

US 2007/0101309 A1    May 3, 2007

(51) Int. Cl.
*H01L 23/528* (2006.01)
(52) U.S. Cl. ............... 257/758; 257/211; 257/208; 257/E23.151; 977/762; 977/932
(58) Field of Classification Search ............... 257/758, 257/202, 208, 211, E23.151; 977/762, 932
See application file for complete search history.

(56) References Cited

U.S. PATENT DOCUMENTS

| | | | |
|---|---|---|---|
| 6,256,767 B1 * | 7/2001 | Kuekes et al. ............... | 716/9 |
| 6,573,613 B2 * | 6/2003 | Arimoto et al. ............ | 365/149 |
| 6,756,645 B2 * | 6/2004 | Shau ............................ | 257/391 |
| 6,861,682 B2 * | 3/2005 | Bang et al. ................... | 257/209 |
| 2001/0033030 A1 * | 10/2001 | Leedy .......................... | 257/777 |
| 2004/0151012 A1 * | 8/2004 | Snider et al. .................. | 365/49 |

FOREIGN PATENT DOCUMENTS

WO    WO2005/004203    1/2005

OTHER PUBLICATIONS

E Rachlin et al—"Analysis of a Mask-Based Nanowire Decoder"—Proc IEEE Computer Society Annual Symposium on VLSI—May 2005—pp. 6-13.
Robert Beckman et al—"Materials science-Bridging dimension: Demultiplexing ultrahigh-density nanowire circuits"—Science vol. 310 No. 5747 Oct. 21, 2005—pp. 465-468.
Dmitri B Strukov et al—"Prospects for terabit-scale nanoelectronic memories"—Nanotechnology vol. 16 No. 1 Jan. 1, 2005—pp. 137-148.

* cited by examiner

*Primary Examiner*—Sue A. Purvis
*Assistant Examiner*—Victor A. Mandala, Jr.

(57) ABSTRACT

Various embodiments of the present invention are directed to crossbar array designs that interfaces wires to address wires, despite misalignments between electrical components and wires. In one embodiment, a nanoscale device may be composed of a first layer of two or more wires and a second layer of two or more address wires that overlays the first layer. The nanoscale device may also include an intermediate layer positioned between the first layer and the second layer. Two or more redundant electrical component patterns may be fabricated within the intermediate layer so that one or more of the electrical component patterns is aligned with the first and second layers.

8 Claims, 26 Drawing Sheets

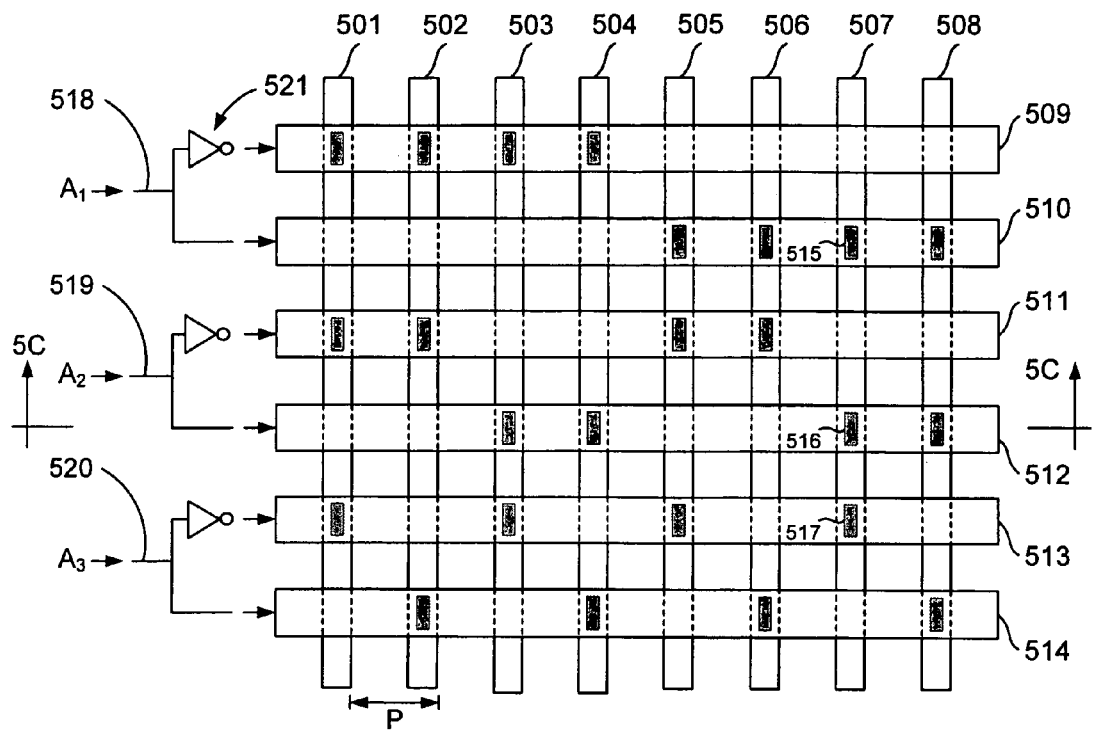
*Figure 5A*
| Nanowire | Address |
|----------|---------|
| 501 | 000 |
| 502 | 001 |
| 503 | 010 |
| 504 | 011 |
| 505 | 100 |
| 506 | 101 |
| 507 | 110 |
| 508 | 111 |
*Figure 5B*
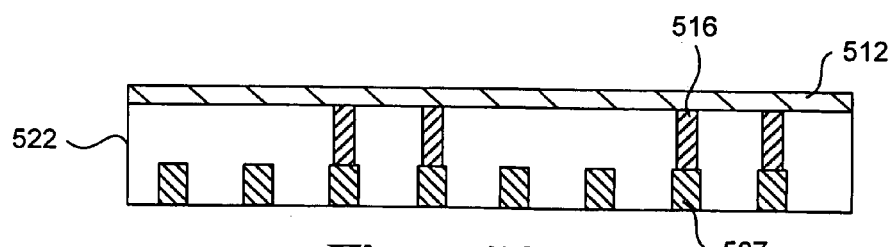
*Figure 5C*

| Nanowire | Address |
|----------|---------|
| 601 | 1100 |
| 602 | 1010 |
| 603 | 1001 |
| 604 | 0110 |
| 605 | 0101 |
| 606 | 0011 |

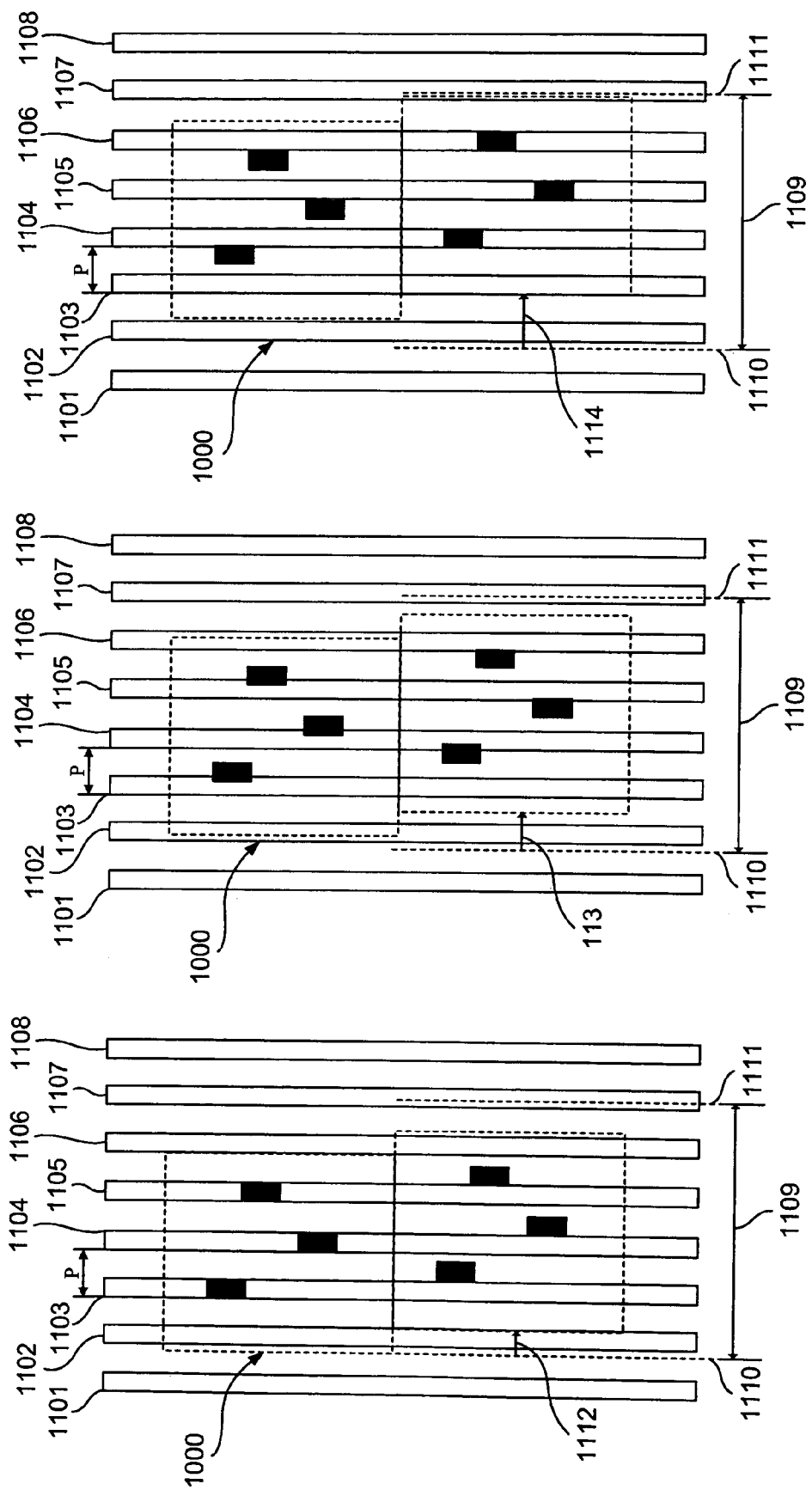

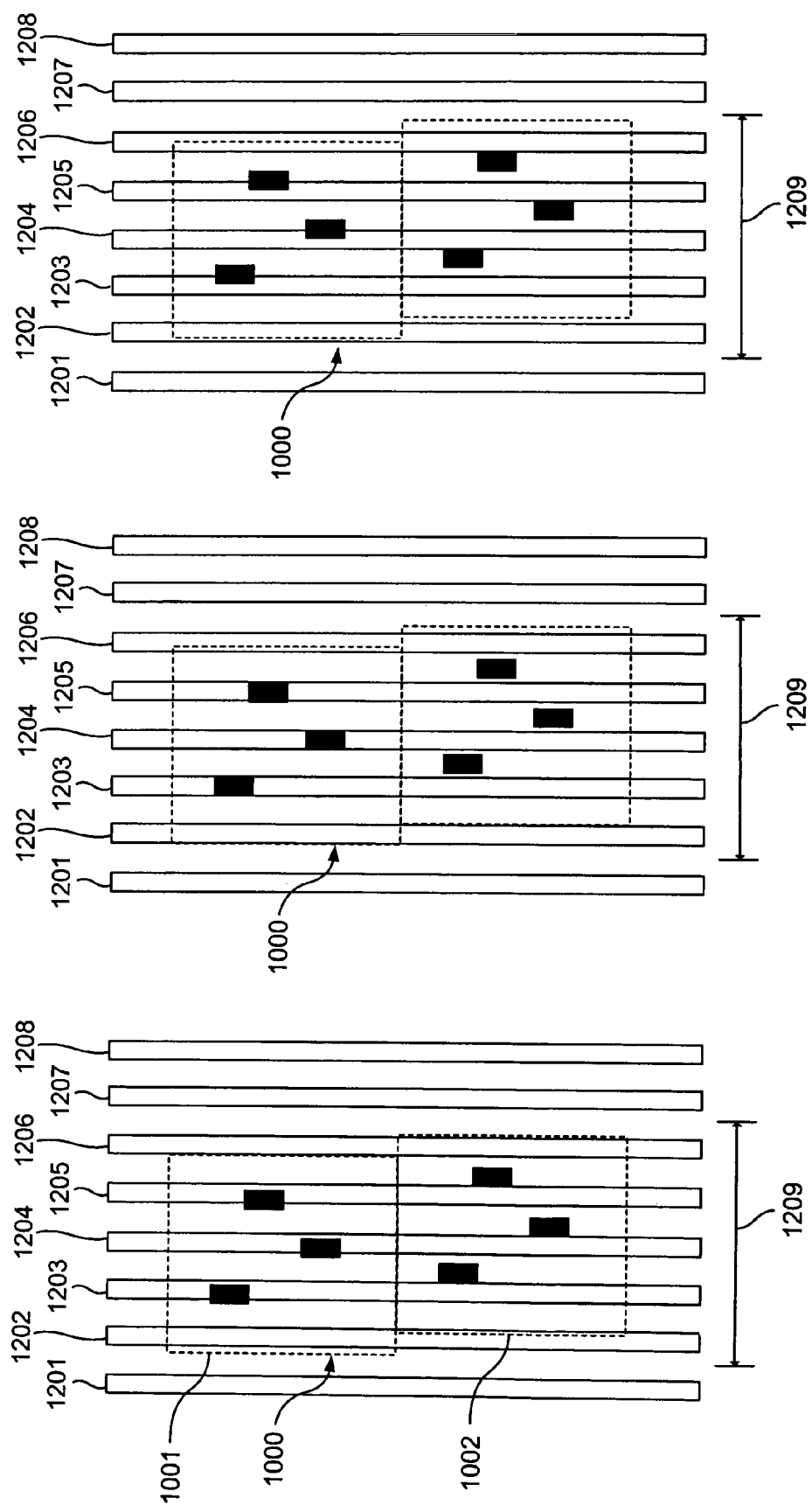

CROSSBAR-ARRAY DESIGNS AND WIRE ADDRESSING METHODS THAT TOLERATE MISALIGNMENT OF ELECTRICAL COMPONENTS AT WIRE OVERLAP POINTS

TECHNICAL FIELD

The present invention relates to electronic devices, and, in particular, to crossbar array designs and wire addressing methods that tolerate misalignment between wires and electrical components that interconnect the wires with overlapping address wires.

BACKGROUND OF THE INVENTION

During the past fifty years, the electronics and computing industries have been relentlessly propelled forward by ever decreasing sizes of basic electronic components, such as transistors and signal wires, and by correspondingly ever increasing component densities of integrated circuits, including processors and electronic memory chips. Eventually, however, it is expected that fundamental component-size limits will be reached in semiconductor-circuit-fabrication technologies based on photolithographic methods. As the size of components decreases below the resolution limit of ultraviolet light (i.e., a wavelength of about 193 nm), for example, far more technically demanding technologies need to be employed to create smaller components using photolithographic techniques, such as next generation lithography. Expensive semiconductor fabrication facilities may need to be rebuilt in order to use the new techniques. Many new obstacles are also expected to be encountered. For example, it is necessary to fabricate semiconductor devices through a series of photolithographic steps, with precise alignment of the masks used in each step with respect to the components already fabricated on the surface of a nascent semiconductor. As the component sizes decrease, precise alignment becomes more and more difficult and expensive. As another example, the probabilities that certain types of randomly distributed defects in semiconductor surfaces result in defective semiconductor devices may increase as the sizes of components manufactured on the semiconductor surfaces decrease, resulting in an increasing proportion of defective devices during manufacture, and a correspondingly lower yield of useful product. Ultimately, various quantum effects that arise only at molecular-scale distances may altogether overwhelm current approaches to component fabrication in semiconductors.

In view of these problems, researchers and developers have expended considerable research effort in fabricating submicroscale and nanoscale electronic devices using alternative technologies. Nanoscale electronic devices generally employ nanoscale signal wires having widths, and nanoscale components having dimensions, of less than 100 nanometers. More densely fabricated nanoscale electronic devices may employ nanoscale signal wires having widths, and nanoscale components having dimensions, of less than 50 nanometers, or, in certain types of devices, less than 10 nanometers.

Although general nanowire technologies have been developed, it is not necessarily straightforward to employ nanowire technologies to miniaturize existing types of circuits and structures. While it may be possible to tediously construct miniaturized, nanowire circuits similar to the much larger, current circuits, it is impractical, and often impossible, to manufacture such miniaturized circuits using current technologies. Even were such straightforwardly miniaturized circuits able to be feasibly manufactured, the much higher component densities that ensue from combining together nanoscale components necessitate much different strategies related to removing waste heat produced by the circuits. In addition, the electronic properties of substances may change dramatically at nanoscale dimensions, so that different types of approaches and substances may need to be employed for fabricating even relatively simple, well-known circuits and subsystems at nanoscale dimensions. Thus, new implementation strategies and techniques need to be employed to develop and manufacture useful circuits and structures at nanoscale dimensions using nanowires.

Nanowire technologies have been developed to fabricate nanoscale electronic devices, such as multiplexer/demultiplexers, by selectively fabricating simple electronic components, such as conductors, transistors, resistors, diodes, and other components, in the gaps between overlapping nanowires and address wires. However, during multiplexer/demultiplexer and logic array fabrication, a number of the electrical components may not be aligned with the nanowires. As a result, certain nanowires may not be addressable because connections cannot be established with overlapping address wires through electrical components. Designers, manufacturers, and users of these systems have recognized the need for multiplexer/demultiplexer and logic array designs that can tolerate electrical-component misalignment at nanowire and address-wire overlap points.

SUMMARY OF THE INVENTION

Various embodiments of the present invention are directed to crossbar array designs that interfaces wires to address wires, despite misalignments between electrical components and wires. In one embodiment, a nanoscale device may be composed of a first layer of two or more nanowires and a second layer of two or more address wires that overlays the first layer. The nanoscale device may also include an intermediate layer positioned between the first layer and the second layer. Two or more redundant electrical component patterns may be fabricated within the intermediate layer so that one or more of the electrical component patterns is aligned with the first and second layers.

DETAILED DESCRIPTION OF THE DRAWINGS

FIGS. 4A-4F schematically illustrate a number of simple electrical components that can be programmed at the nanowire junctions of nanowires in nanowire crossbars.

FIGS. 5A-5B illustrate an exemplary binary-code multiplexer/demultiplexer that employs diode/resistor logic.

FIG. 5C illustrates a cross-sectional view of the binary-code multiplexer/demultiplexer shown in FIG. 5A.

Figures 6A, 6B:
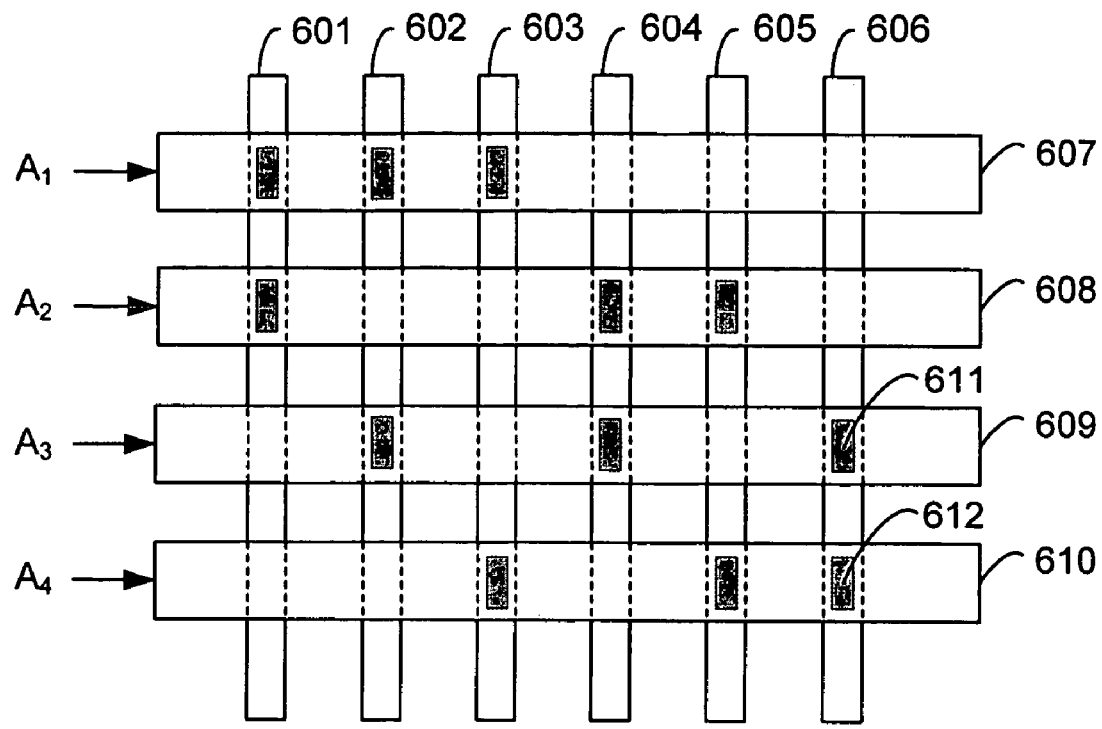

FIGS. 6A-6B illustrates an exemplary multiplexer/demultiplexer designed according to an M-bit, N-hot code that employs diode/resistor logic.

Figure 7A:
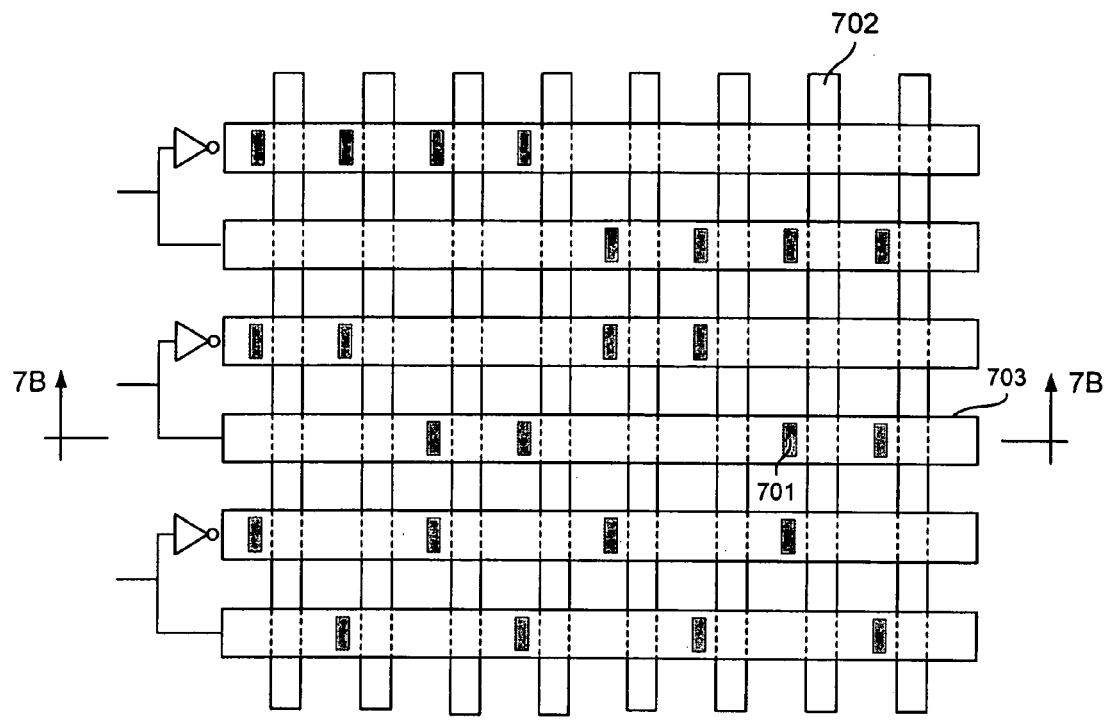

FIG. 7A illustrates a nonfunctional, exemplary binary-code multiplexer/demultiplexer having electrical components that are misaligned with nanowires.

Figure 7B:
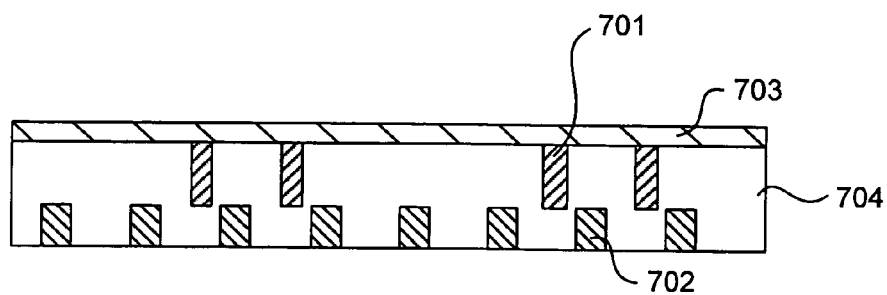

FIG. 7B illustrates a cross-sectional view of the multiplexer/demultiplexer shown in FIG. 7A.

Figure 8A:
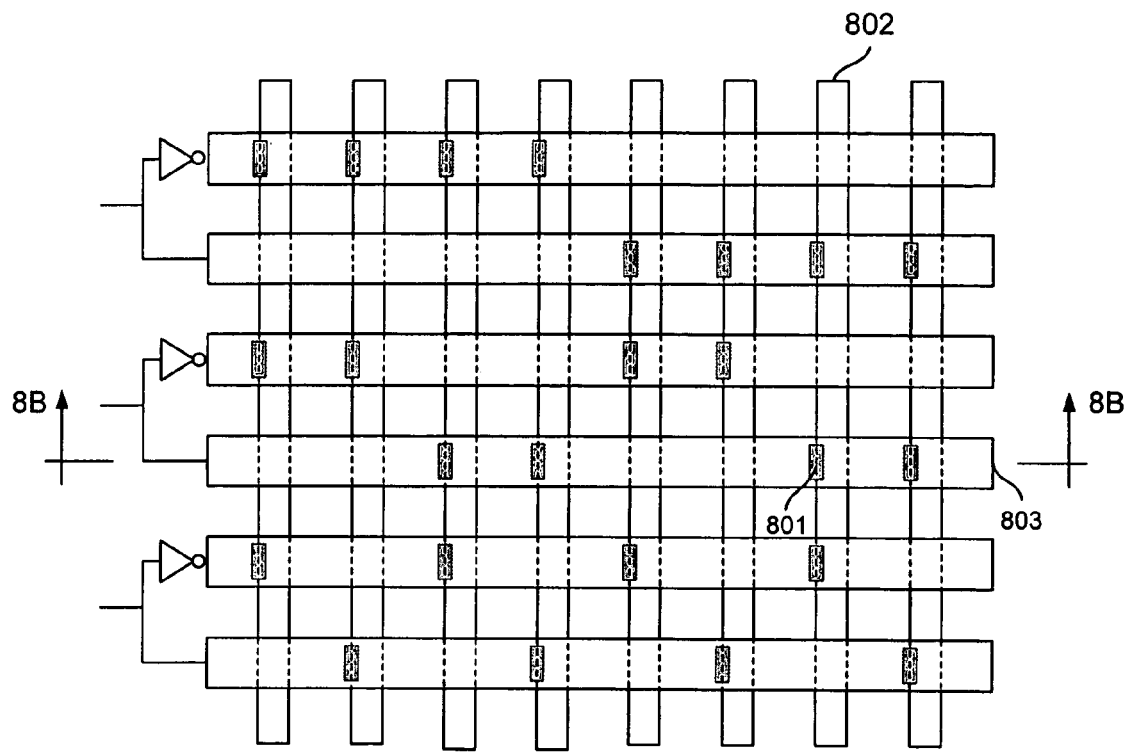

FIG. 8A illustrates a functional, exemplary binary-code multiplexer/demultiplexer having electrical components that are misaligned with nanowires.

Figure 8B:
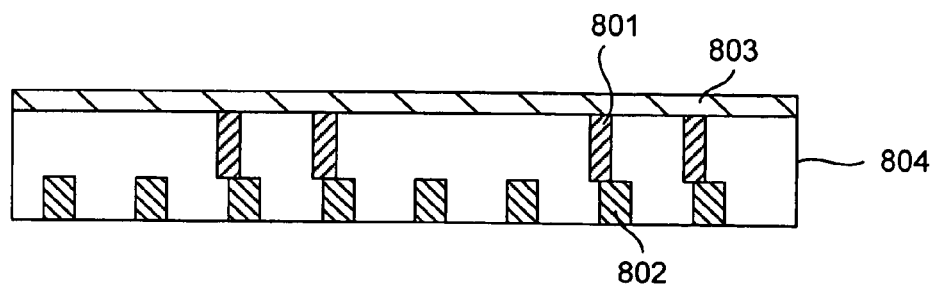

FIG. 8B illustrates a cross-sectional view of the multiplexer/demultiplexer shown in FIG. 8A.

Figure 9A:
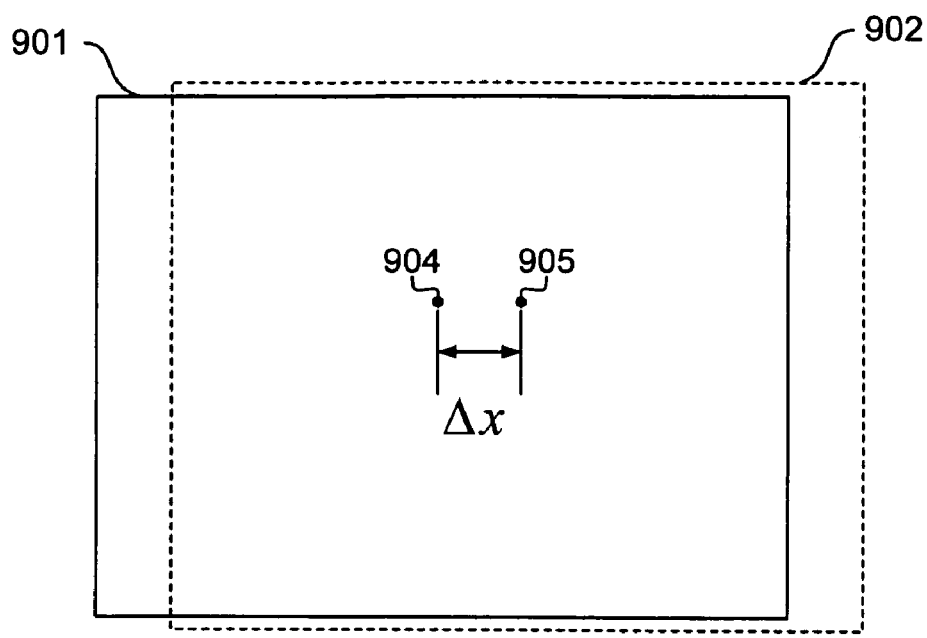
Figure 9B:
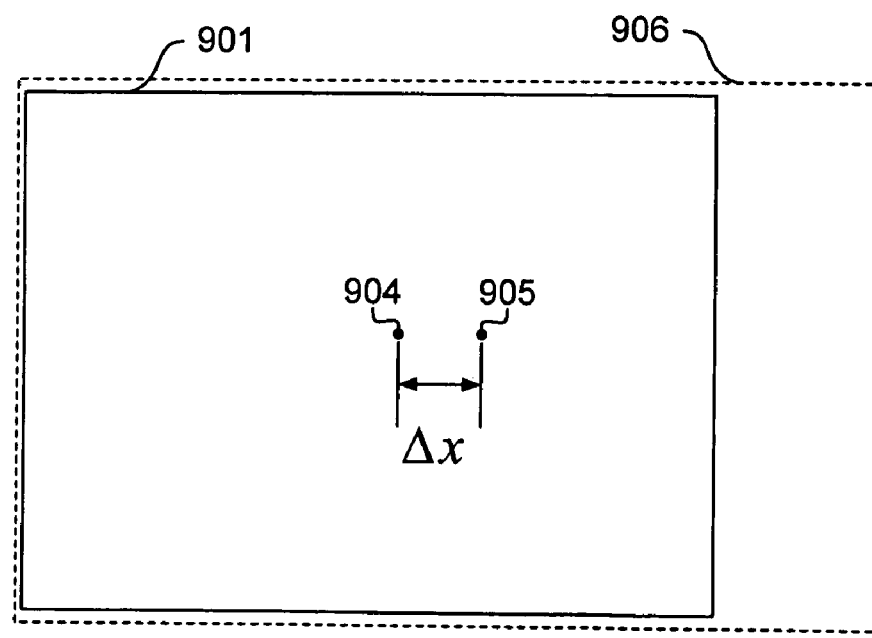

FIGS. 9A-9B illustrate expansion of a nanowire region of a multiplexer/demultiplexer to accommodate two or more redundant electrical component patterns.

Figure 10A:
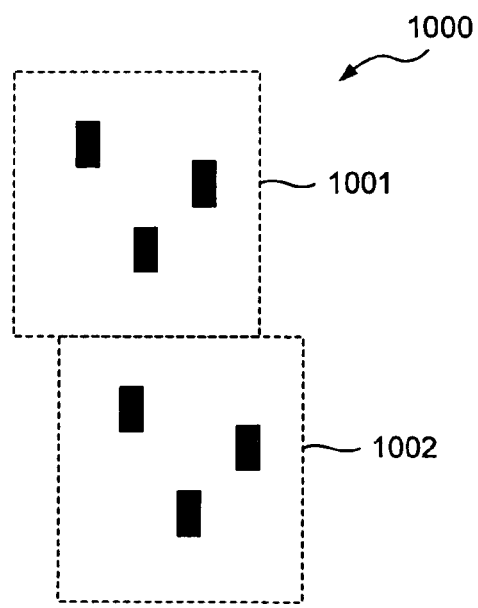

FIG. 10A illustrates an example addressing pattern that represents one embodiment of the present invention.

Figure 10B:
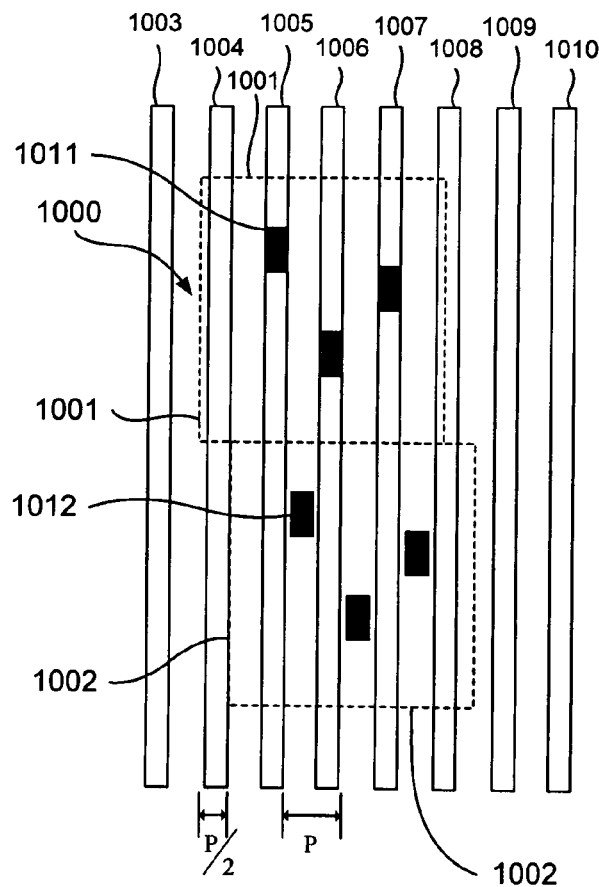

FIG. 10B illustrates an example alignment of the addressing pattern shown in FIG. 10A with three of eight nanowires.

FIG. 11 illustrates three of an infinite number of alignments the addressing pattern shown in FIG. 10A can have with respect to a set of nanowires.

FIGS. 12A-12C illustrate three of infinitely many possible alignments the addressing pattern, shown in FIG. 10B, can have with three nanowires.

FIGS. 13A-13D illustrate four representative alignments the addressing pattern, shown in FIG. 10A, can have with nanowires.

Figure 14:
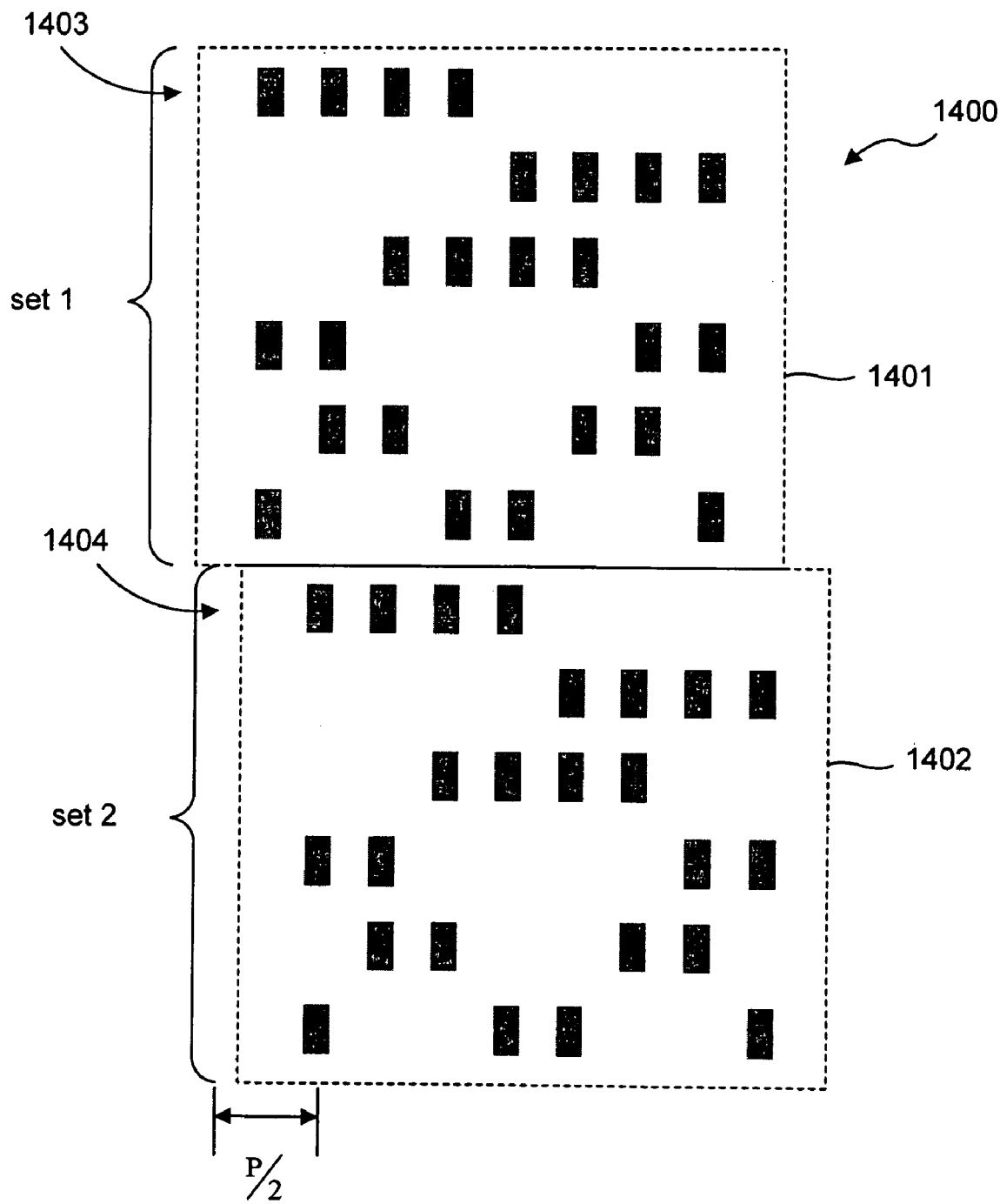

FIG. 14 illustrates an example addressing pattern used to fabricate four exemplary representative multiplexer/demultiplexer alignments shown in FIGS. 15-18.

FIGS. 15-18 illustrate four representative alignments of the addressing pattern shown in FIG. 14 with nanowires of a binary code multiplexer/demultiplexer, each representative alignment representing an embodiment of the present invention.

Figure 17:
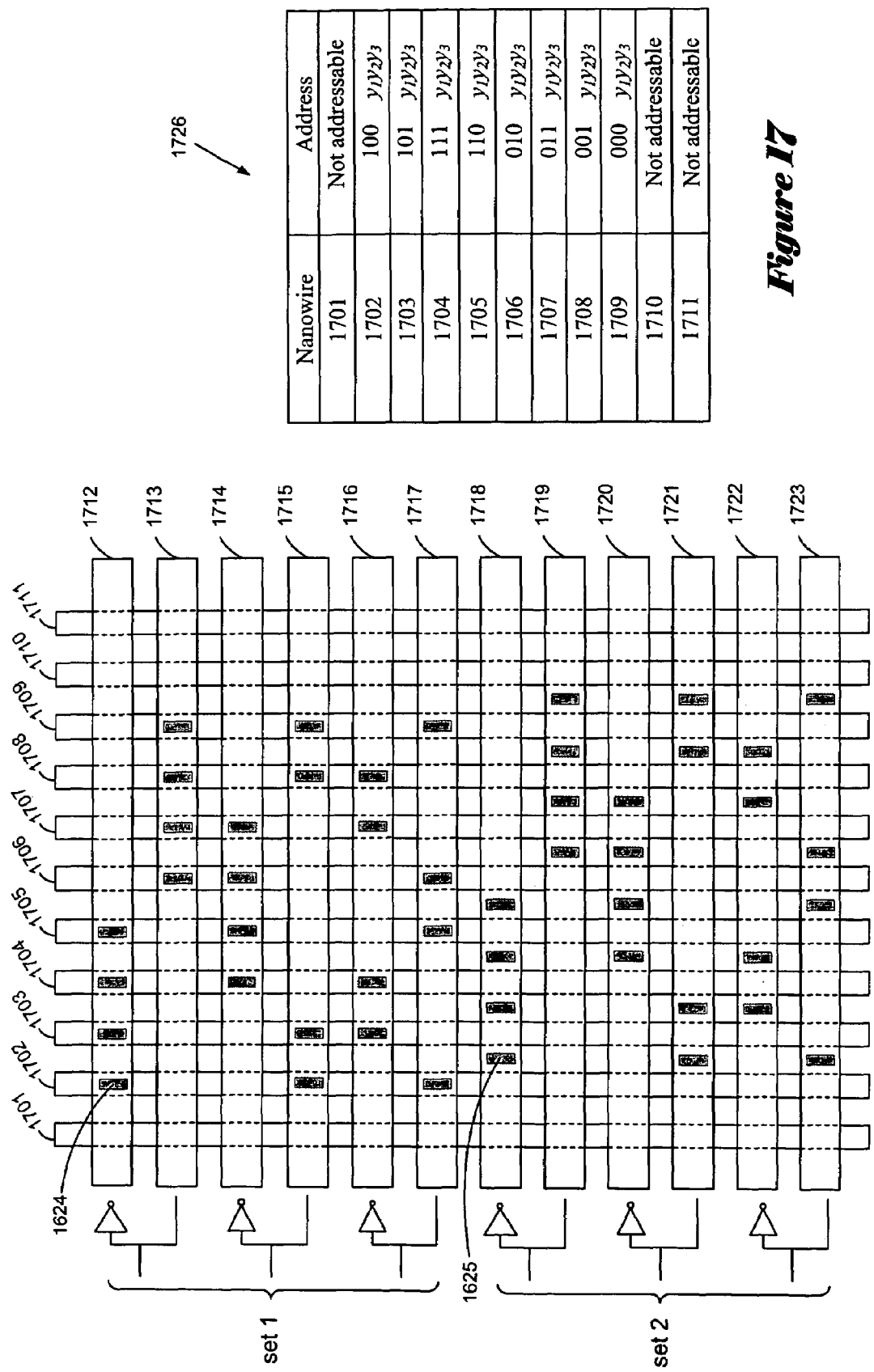
Figure 18:
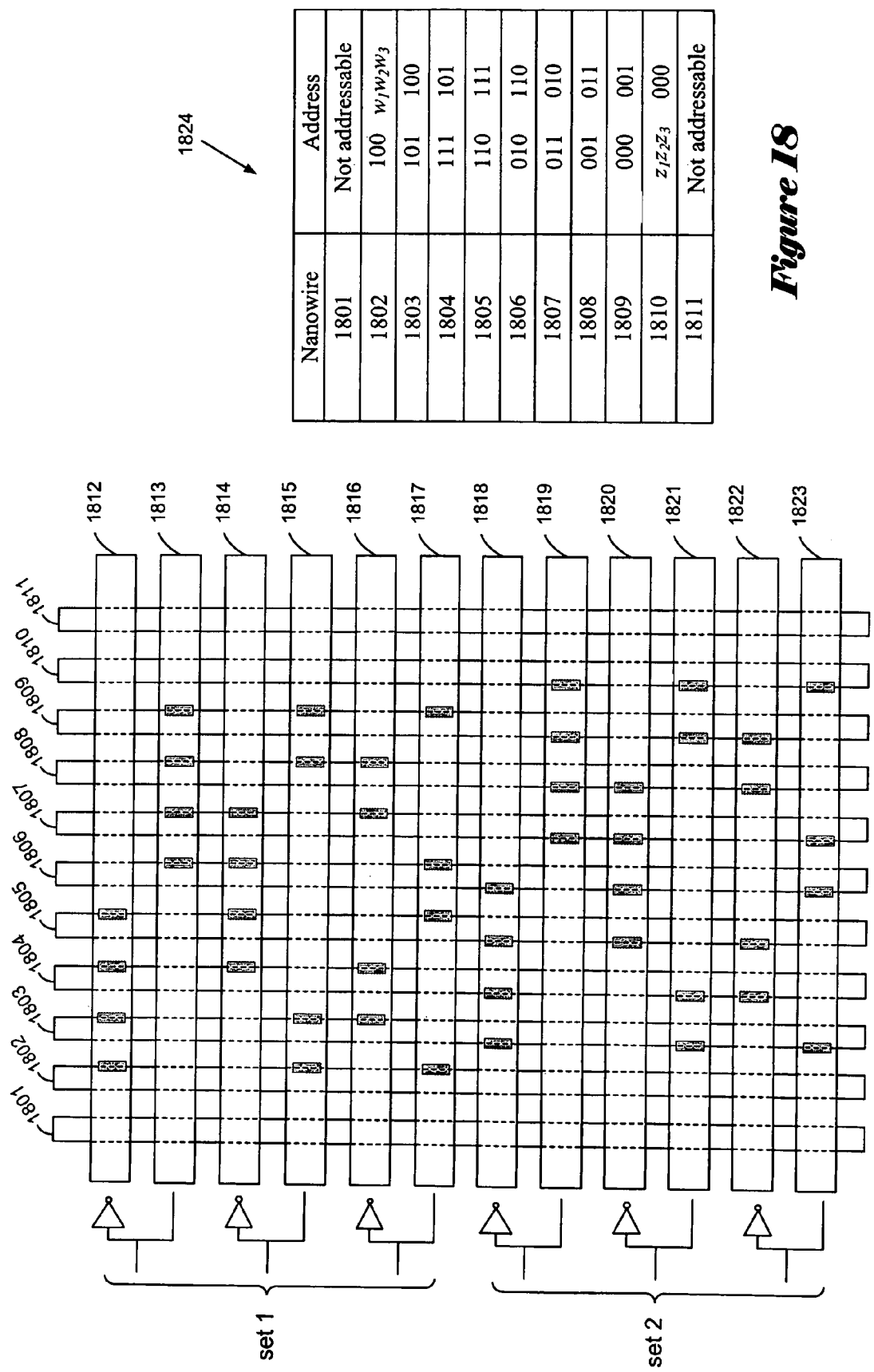
Figure 19:
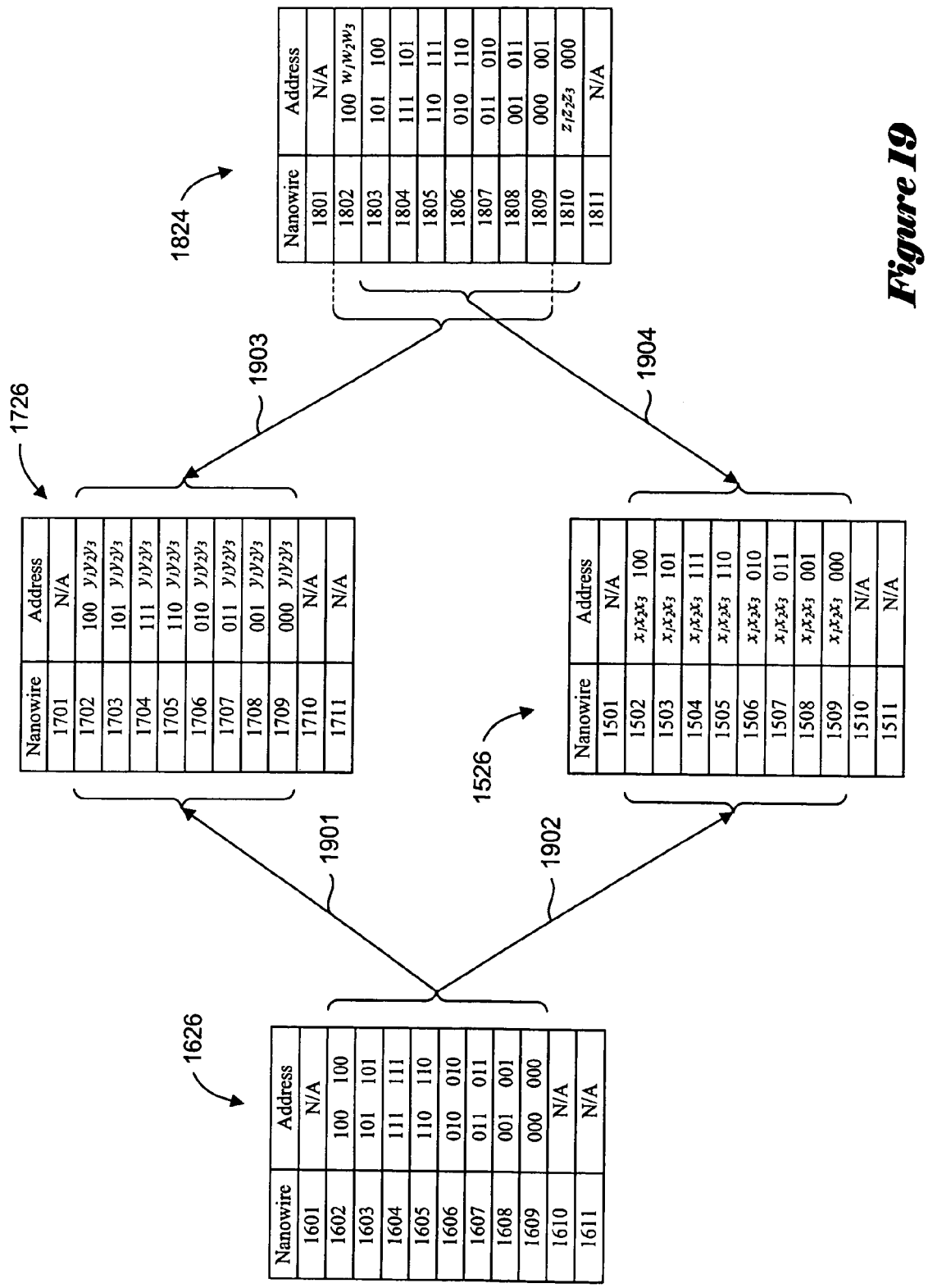

FIG. 19 shows the tables of 6-bit addresses shown in FIGS. 15-18 that can be used to address nanowires of a hypothetical multiplexer/demultiplexer.

Figure 20:
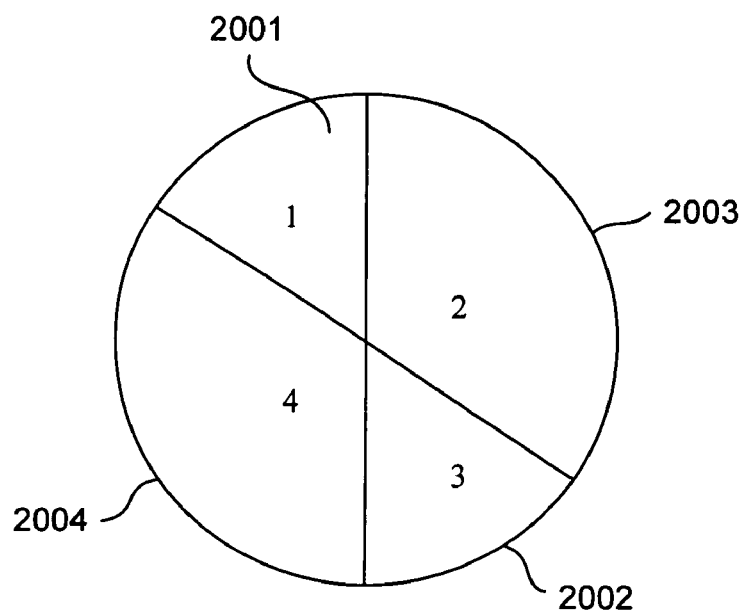

FIG. 20 illustrates probabilities of fabricating a multiplexer/demultiplexer represented by one of the four representative alignments described above with reference to FIGS. 15-18, for a nanowire width equal to approximately one-half the period of the nanowire spacing, and an electrical-component width equal to approximately one-third the period of the nanowire spacing.

Figure 21:
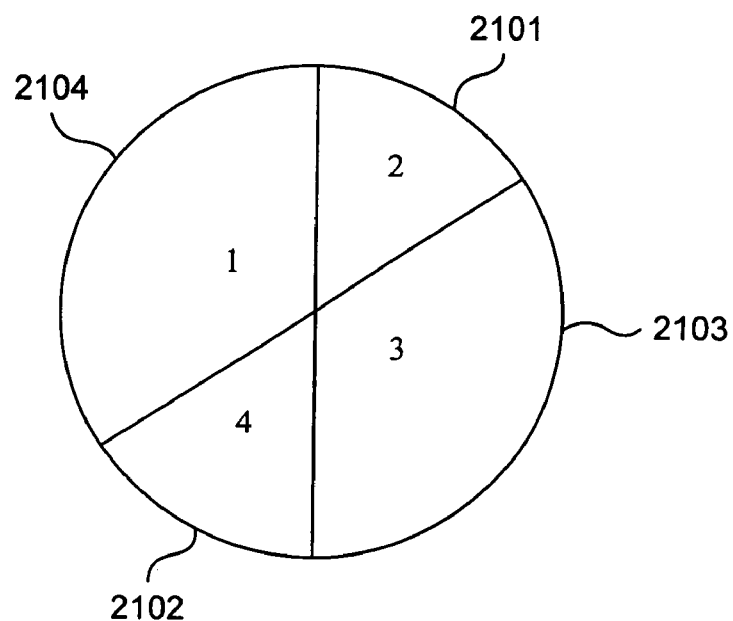

FIG. 21 illustrates the probability of fabricating a multiplexer/demultiplexer represented by one of the four representative alignments, such as the four representative alignments described above with reference to FIGS. 15-18, for a nanowire width and electrical component width equal to approximately one-third the period of the nanowire spacing.

Figure 22:
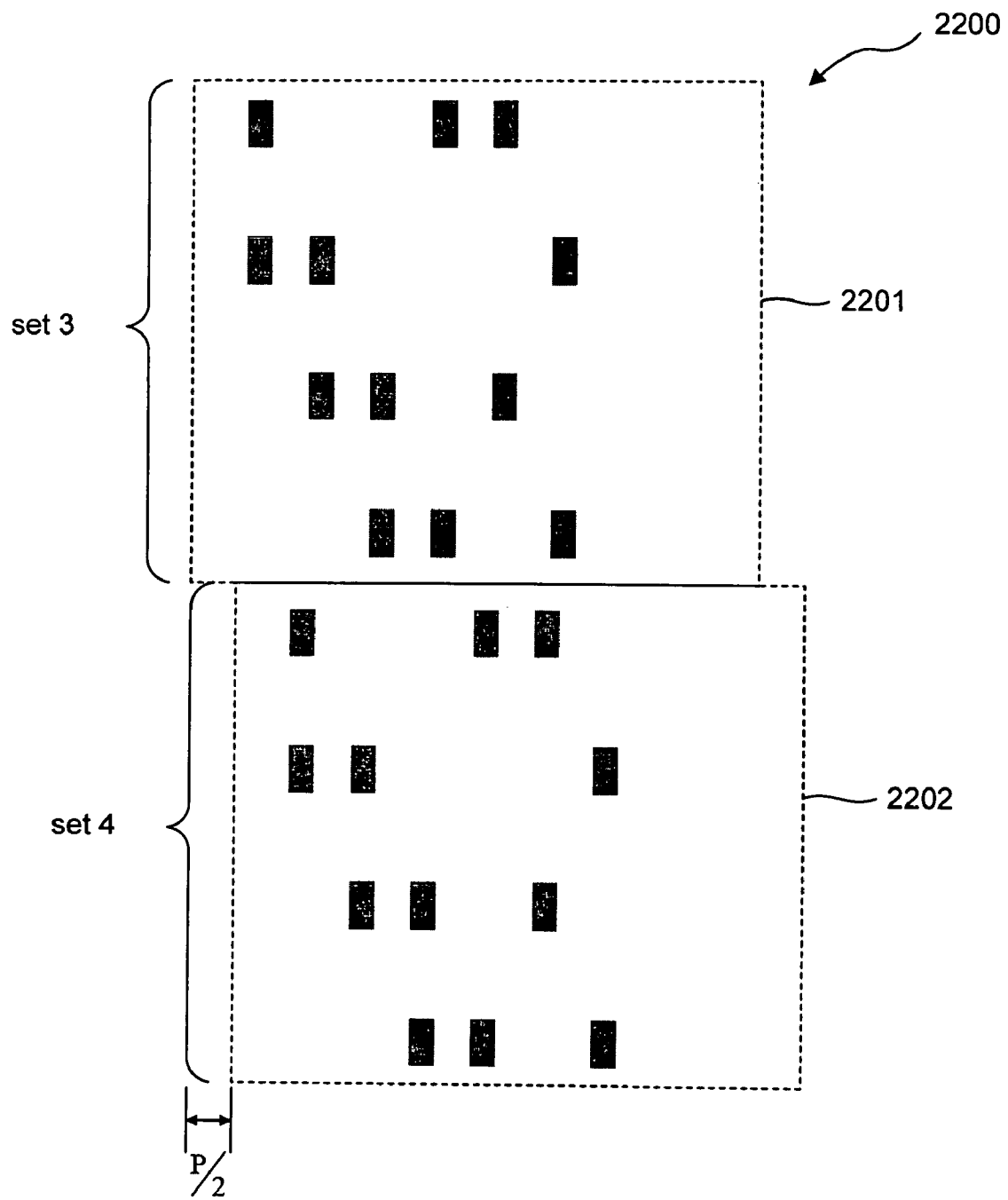

FIG. 22 illustrates an example addressing pattern used to fabricate four exemplary representative multiplexer/demultiplexer alignments shown in FIGS. 23-26.

FIGS. 23-26 illustrate four representative alignments of the addressing pattern shown in FIG. 22 with nanowires of an MNH multiplexer/demultiplexer, each representative addressing-pattern alignment representing an embodiment of the present invention.

Figure 25:
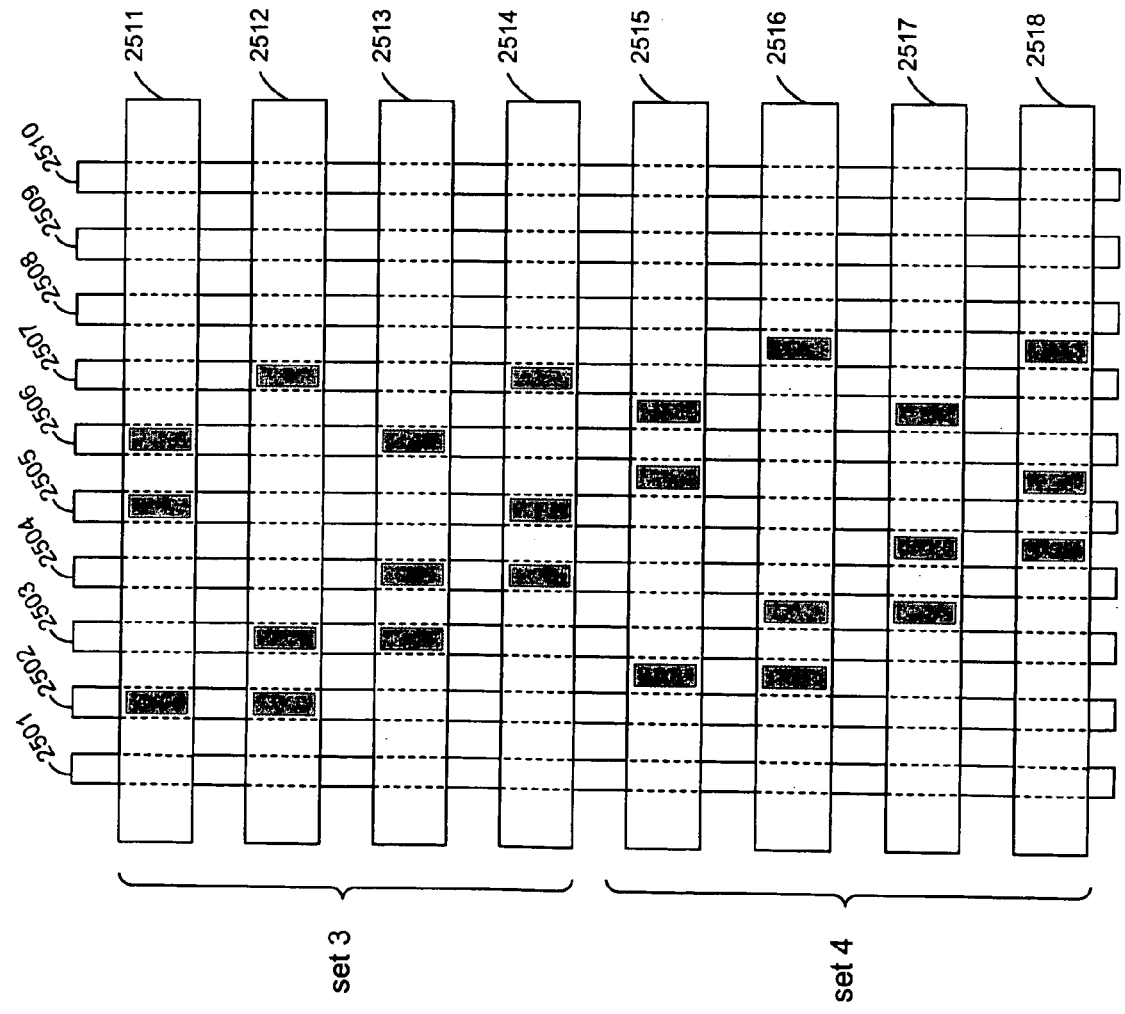
Figure 26:
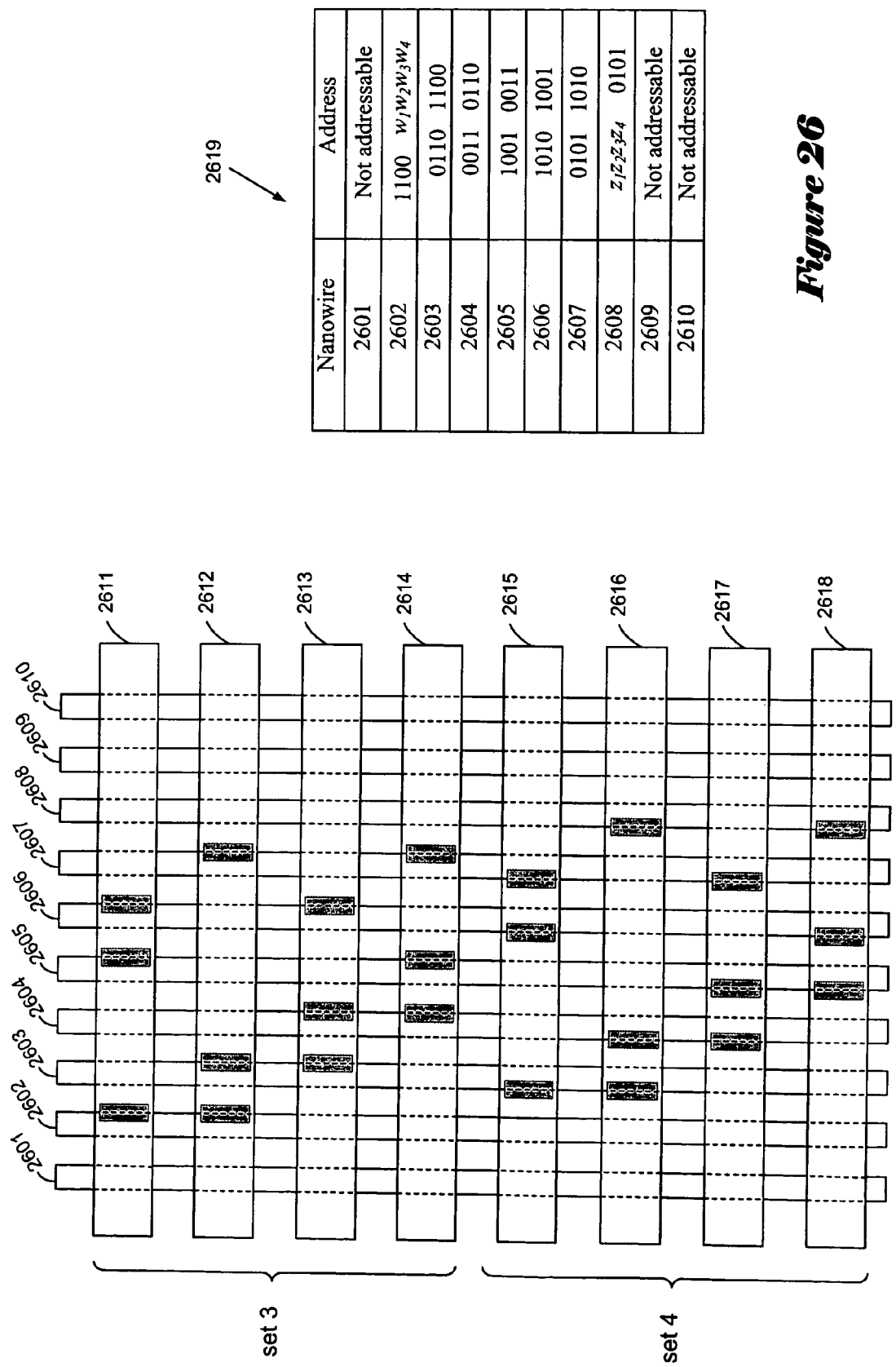
Figure 27:
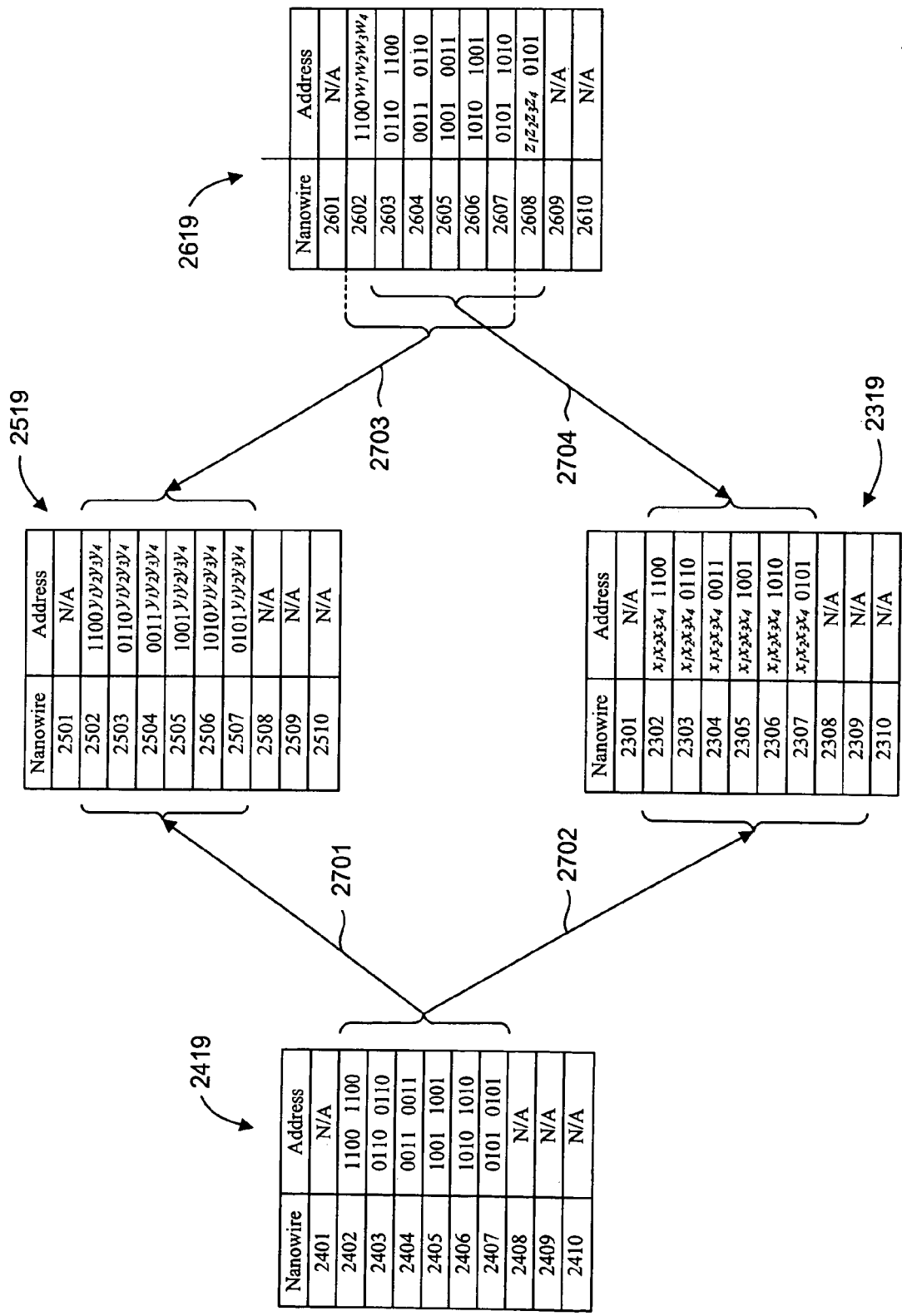

FIG. 27 shows the tables of 8-bit addresses shown in FIGS. 23-26 that can be used to address nanowires of a hypothetical multiplexer/demultiplexer.

DETAILED DESCRIPTION OF THE INVENTION

As discussed below, crossbar arrays represent one of a number of emerging electronic-configuration media that can be used to construct electronic devices, such as multiplexer/demultiplexers and logic arrays. Crossbar arrays are typically composed of a layer of wires, an orthogonal overlapping address-wire layer, and an intermediate layer having a pattern of electrical components connecting address wires to wires at certain overlap points. However, certain wires may not be addressable because during fabrication, a number of the electrical components may not be aligned with the wires. Various embodiments of the present invention are directed to crossbar array designs employing two or more sets of address wires and two or more staggered, redundant electrical component patterns. Each redundant electrical component pattern is staggered with respect to the locations of the other electrical component patterns so that no two electrical component patterns have the same alignment with the wires. As a result, there is an increased probability that a desired number of wires can be addressed by one or more of the redundant electrical component patterns. In addition, the redundant electrical component patterns connecting the overlapping layers of wires and address wires are associated with sets of wire addresses that can each be used to address the wires. The present invention is described below in the following two subsections: (1) overview of crossbars arrays, and (2) embodiments of the present invention.

Overview of Crossbars Arrays

Figure 1:
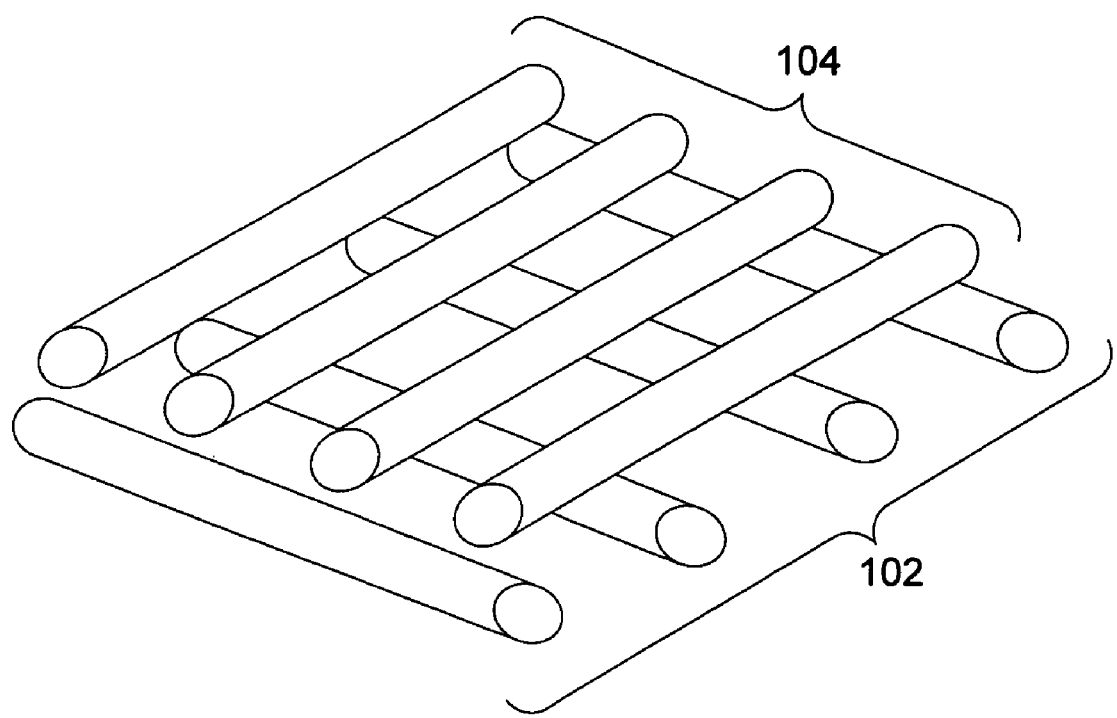
FIG. 1 illustrates a nanowire crossbar.

A relatively new and promising technology for manufacturing electronic devices involves nanowire crossbars. FIG. 1 illustrates a nanowire crossbar. In FIG. 1, a first layer of approximately parallel nanowires 102 is overlain by a second layer of approximately parallel nanowires 104 roughly perpendicular, in orientation, to the nanowires of the first layer 102, although the orientation angle between the layers may vary. The two layers of nanowires form a lattice, or crossbar, each nanowire of the second layer 104 overlying all of the nanowires of the first layer 102 and coming into close contact with each nanowire of the first layer 102 at nanowire intersections that represent the closest contact between two nanowires. Although individual nanowires in FIG. 1 are shown with circular cross sections, nanowires can also have square, rectangular, elliptical, or more complex cross sections. The nanowires may also have many different widths or diameters and aspect rations or eccentricities. The term "nanowire crossbar" may refer to crossbars having one or more layers of sub-microscale, microscale, or wires with larger dimensions in addition to nanowires.

Nanowires can be fabricated using lithography, such as mechanical nanoprinting techniques. Alternatively, nanowires can be chemically synthesized and can be deposited as layers of nanowires in one or a few process steps. Other alternative techniques for fabricating nanowires may also be employed. Thus, a two-layer nanowire crossbar comprising first and second layers, as shown in FIG. 1, can be manufactured by any of numerous relatively straightforward processes. Many different types of conductive and semi-conductive nanowires can be chemically synthesized from metallic and semiconductor substances, from combinations of these types of substances, and from other types of substances. A nanowire crossbar may be connected to microscale address-wire leads or other electronic leads through a variety of different methods to incorporate the nanowires into electrical circuits.

Figure 2:
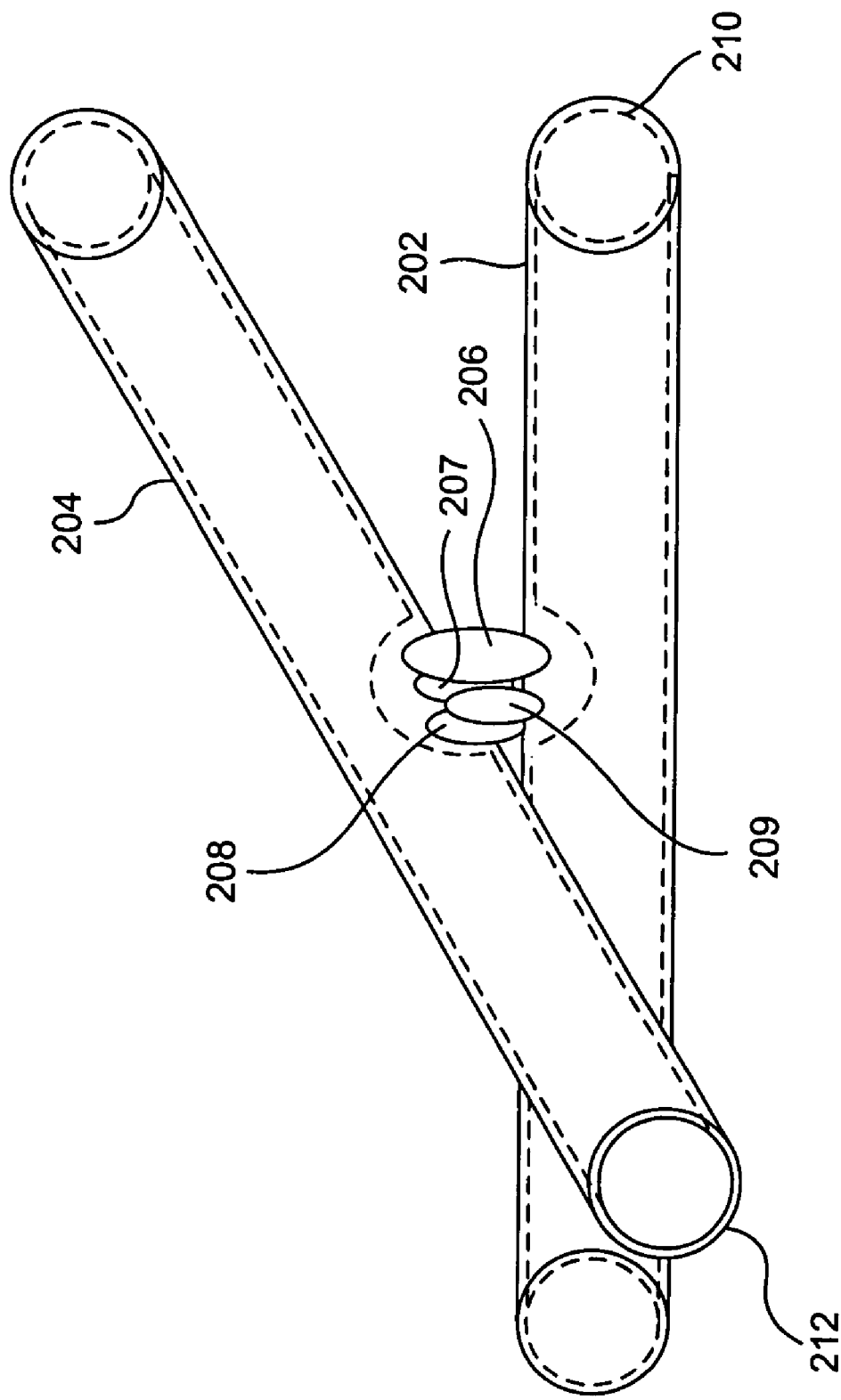
FIG. 2 illustrates a nanowire junction between two roughly orthogonal nanowires.

Nanowire crossbars may be used to create arrays of nanoscale electronic components, such as transistors, diodes, resistors, and other familiar basic electronic components. FIG. 2 illustrates a nanowire junction that interconnects nanowires 202 and 204 of two contiguous layers within a nanowire crossbar. Note that the nanowire junction may or may not involve physical contact between the two nanowires 202 and 204. As shown in FIG. 2, the two nanowires are not in physical contact at their overlap point, but the gap between them is spanned by a small number of molecules 206-209. Various different types of molecules may be introduced at nanowire junctions for a variety of different purposes. In many cases, the molecules of a nanowire junction may be accessed, for various purposes, through different voltage levels or current levels placed on the nanowires forming the nanowire junction. The molecules spanning the nanowire junction in FIG. 2 may have various different quantum states in which the molecules exhibit resistive, semiconductor-like, or conductive electrical properties. The current passing between the two nanowires interconnected by a nanowire junction may be a nonlinear function of the voltage across the nanowire junction as a result of quantum-mechanical tunneling of electrons through relatively low-energy, unoccupied quantum states of the molecules. The quantum states, and relative energies of quantum states, of the molecules may be controlled by applying differential currents or voltages to the nanowires forming the interaction. For example, molecules may be conductive in a reduced state, but may act as insulators in an oxidized state, with redox reactions controlled by voltage levels determining which of the quantum states the molecules inhabit.

In general, a nanowire junction is anisotropic, having a polarity or direction with respect to physical properties, including electrical properties. This anisotropy may arise from different chemical and/or physical properties of nanowires in the two layers of a nanowire crossbar, may arise from asymmetries of nanowire-junction molecules, and uniform orientation of the nanowire-junction molecule with respect to the nanowire layers, and may arise both from differences in the properties of the nanowires as well as nanowire-junction-molecule asymmetries. The fact that nanowire junctions may have polarities allows for controlling nanowire junction properties by applying positive and negative voltages to nanowire junctions, eliciting forward and reverse currents within the nanowire junctions.

As shown in FIG. 2, the nanowires may include outer coatings, such as outer coatings 210 and 212. The outer coatings may serve to insulate nanowires from one another, may constitute the molecules that serve to span nanowire junctions when the nanowires are placed in contact with one another, and/or may serve as modulation-dopant-layers, which can be selectively activated to dope semiconductor nanowires. Both p-type and n-type modulation dopant coatings have been developed. In other applications, the molecules spanning nanowire junctions between overlapping nanowires may be introduced as a separate layer, referred to as "intermediate layer," formed between layers of nanowires. In some cases, the state changes of nanowire-junction molecules may not be reversible. For example, the nanowire-junction molecules may initially be resistive, and may be made conductive through application of relatively high voltages. In other cases, the nanowire-junction molecules may be conductive, but the molecules may be irreversibly damaged, along with portions of the nanowires proximal to the nanowire junctions, through application of very high voltage levels, resulting in disrupting conductivity between the two nanowires and breaking electrical connection between them. In yet other cases, the nanowire-junction molecules may transition reversibly from one state to another and back, so that the nanoscale electrical components configured at nanowire junctions may be reconfigured, or programmed, by application of differential voltages to selected nanowire junctions.

One type of nanowire junction that can be configured behaves as if it were a resistor in series with a switch that may be opened or closed. When the switch is closed, the nanowire-junction molecule connects the overlapping nanowires at the nanowire junction. When the switch is open, the nanowire junction molecule spanning the nanowire junction has no effect on the current.

Figure 3A:
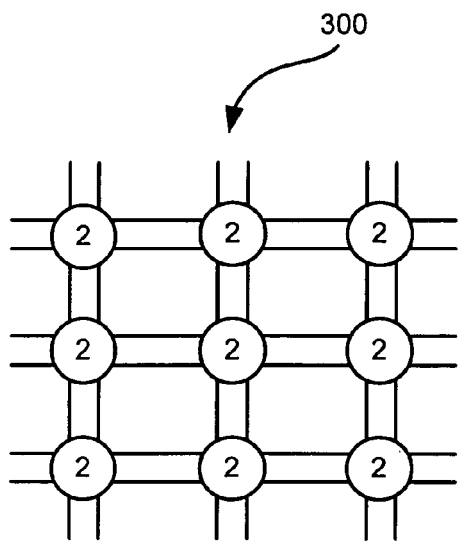
FIGS. 3A-3D illustrate one of many possible approaches for configuring a network of nanoscale electrical components from a two-layer nanowire crossbar.
Figure 3B:
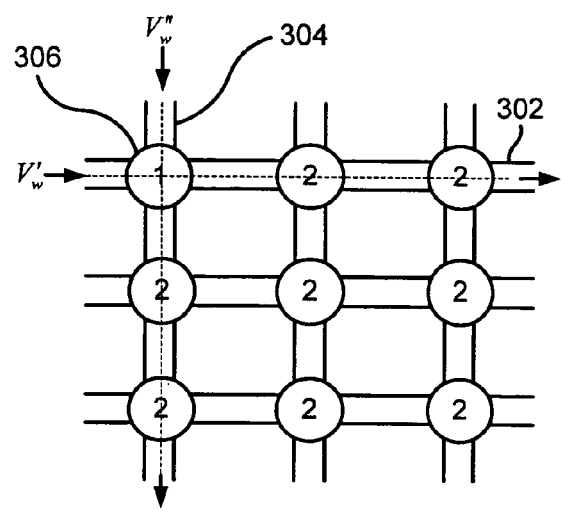
Figure 3C:
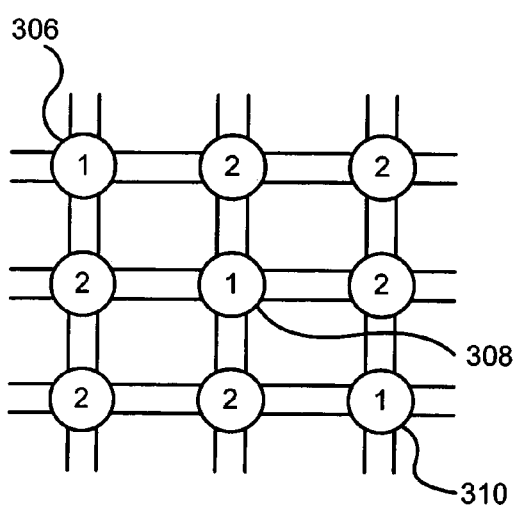
Figure 3D:
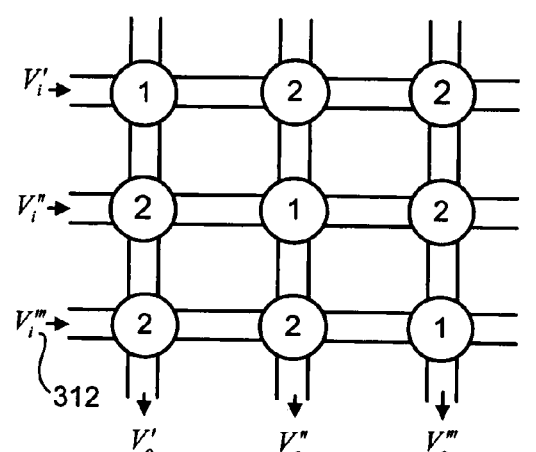

Nanowire junctions can be configured electrically, optically, mechanically or by other means. FIG. 3 illustrates one possible approach to configuring a network of reconfigurable nanoscale electrical components from a two-layer nanowire crossbar. In FIGS. 3A-3D, a small 3×3 nanowire crossbar is shown, with circles at all nine nanowire junctions that indicate the state of the nanowire-junction molecules. In one state, labeled "1" in FIGS. 3A-3D, the nanowire-junction molecules may have certain semiconductor, or conductive properties, while in a second state, labeled "2" in FIGS. 3A-3D, nanowire-junction molecules may have different properties. Initially, as shown in FIG. 3A, the states of the nanowire junctions of the nanowire crossbar 300 are in the state labeled "2." Next, as shown in FIG. 3B, each nanowire junction may be uniquely accessed by applying a WRITE voltage, or configuring voltage, to the nanowires that form the nanowire junction in order to configure, or program, the nanowire junction to have the state "1." For example, in FIG. 3B, a first WRITE voltage $v_w'$ is applied to horizontal nanowire 302 and a second WRITE voltage $v_w''$ is applied to vertical nanowire 304 to change the state of the nanowire junction 306 from "2" to "1." Individual nanowire junctions may be configured through steps similar to the steps shown in FIG. 3B, resulting finally in a fully configured nanoscale component network as shown in FIG. 3C. Note that, in FIG. 3C, the states of nanowire junctions 306, 308, and 310, forming a downward-slanted diagonal through the nanowire crossbar have been configured by selective application of WRITE voltages. Finally, as shown in FIG. 3D, the nanoscale electrical component network can be used as a portion of an integrated circuit. Input voltages $v_i'$, $v_i''$, and $v_i'''$ may be applied to the nanoscale electrical component lattice as inputs 312 and output voltages $v_o'$, $v_o''$, and $v_o'''$ 314 may be accessed as the result of operation of the nanoscale electrical component network that represents a portion of an integrated circuit. In general, the input and output voltages $v_i'$, $v_i''$, and $v_i'''$ and $v_o'$, $v_o''$, and $v_o'''$ have relatively low magnitudes compared with the WRITE voltages $v_w$. Depending on the types of nanowires, types of dopants employed in the case of semiconductor nanowires, and the types of nanowire-junction molecules employed in the nanowire crossbar, many different, but similar configuring processes may be used to configure nanowire crossbars into nanowire-based electrical components networks. The example of FIG. 3 is meant to illustrate a general process by which nanowire crossbars may be configured as useful portions of electronic circuits.

Figure 4A:
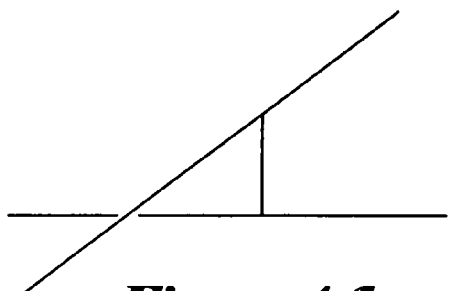
Figure 4B:
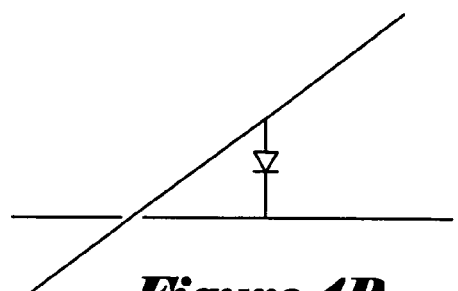
Figure 4C:
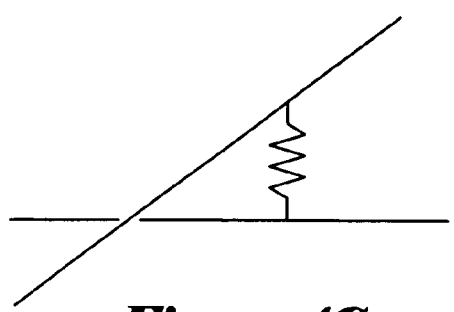
Figure 4D:
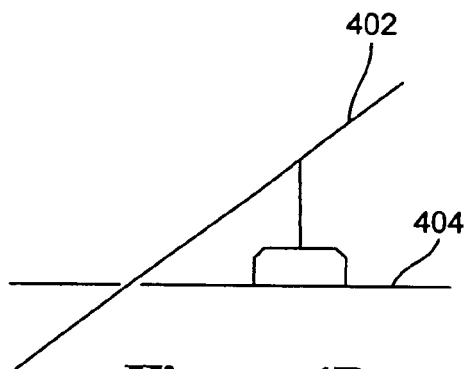
Figure 4E:
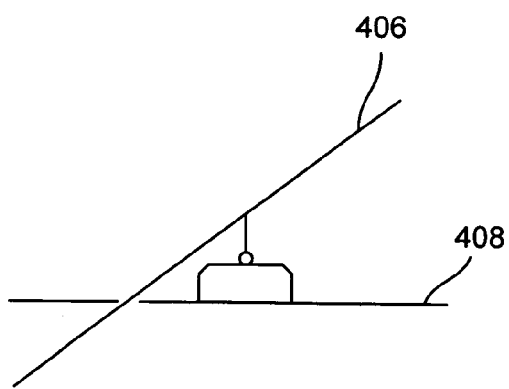
Figure 4F:
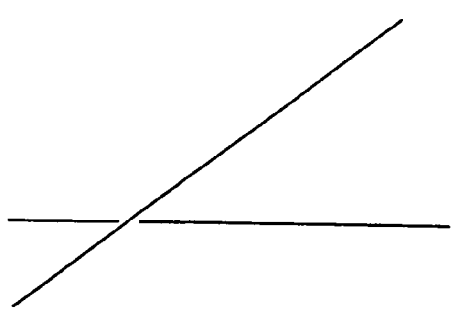

Nanowire junctions in nanowire crossbars may be configured, in various techniques depending on the chemical nature of the nanowires and nanowire-junction-spanning molecules, to form a wide variety of different, simple electronic components. Holes for retaining electrical components that interconnect overlapping nanowires can be fabricated in an intermediate layer between overlapping layers of nanowires using lithographic methods, such as nano-imprint lithography, extreme ultraviolate lithography, or electron-beam ion-beam lithography. FIG. 4 schematically illustrates a number of simple electrical components that can be configured at nanowire junctions in nanowire crossbars. A nanowire junction may represent (1) a simple conductive connection between two nanowires, as shown in FIG. 4A; (2) a diode that conducts current in only one direction between two nanowires, as shown in FIG. 4B; (3) a resistor, with the magnitude of resistance configurable by application of different configuring voltages, as shown in FIG. 4C; (4) n-type field-effect transistor ("nFET"), as shown in FIG. 4D; (5) p-type field-effect transistor ("pFET"), as shown in FIG. 4E; and (6) the overlapping of two conductive nanowires, with the voltage and current associated with each nanowire completely independent from one another, as shown in FIG. 4F.

The nFET and pFET electrical components perform switch operations, controlled by the signal level placed on gate wires, that can either enable or disable source/drain wires. An enabled source/drain wire allows current to flow beyond the nFET or pFET electrical component, and the flow of current beyond the nFET or pFET electrical component is not allowed in a disabled source/drain wire. However, nFETs and pFETs exhibit opposite behavior based on the signal level applied to the gate wires. In the case of the nFET, shown in FIG. 4D, a relatively low signal on the gate nanowire 402 causes the nFET to disable source/drain nanowire 404, while a relatively high signal on gate nanowire 402 causes nFET to enable source/drain nanowire 404. By contrast, in the case of the pFET, shown in FIG. 4E, a relatively low signal on gate nanowire 406 causes the pFET to enable source/drain nanowire 408, and a relatively high signal on gate nanowire 406 causes the pFET to disable source/drain nanowire 408. Note that a electrical component may also be configured as an insulator, essentially interrupting conduction at the electrical component with respect to both overlapping nanowires.

Thus, as discussed above with reference to FIGS. 1-4, a two-dimensional nanowire crossbar may be fabricated and then configured as a network of electrical components. Note also that a nanowire junction, although shown in FIGS. 4A-4F to comprise the nanowire junction of two single nanowires, may also comprise a number of nanowire junctions between a number of nanowires in a first layer of a nanowire crossbar that together comprise a single conductive element and the nanowires in a second nanowire layer that together comprise a second conductive element.

The configurable electrical resistances of nanowire junctions are important and special properties of certain types of nanowire junctions. When certain types of molecules are used for nanowire junctions, the initially relatively high resistances of the nanowire junctions may be lowered by applying relatively large positive voltages to the nanowire junctions. The resistances of the nanowire junctions may be a function of the magnitude of the highest voltages applied to the nanowire junction. By applying higher and higher positive voltages to a nanowire junction, the resistance of the nanowire junction may be made lower and lower. A relatively low resistivity state achieved by application of a positive voltage may be reversed by applying a sufficiently high, negative voltage. Thus, not only is the electrical resistance of a nanowire junction configurable, the electrical resistance may also be reconfigurable, depending on the type of molecules forming the nanowire junction.

Note that the term "signal" may refer to detectable low or high physical quantities that are carried by nanowire-crossbar wires, such as voltage and current. The terms "low" and "high" generally refer to a range of values associated with a signal. For example, a signal that ranges between no signal and a signal threshold may be called a "low signal," and any signal above the signal threshold is called a "high signal." A low signal is represented by the bit value "0," and a high signal is represented by the bit value "1."

A particularly useful type of nanowire crossbar is a multiplexer/demultiplexer. Multiplexer/demultiplexers can be used to address nanowires. FIGS. 5A-6B illustrate two types of exemplary nanowire-crossbar multiplexer/demultiplexers that employs diode/resistor logic. In both FIGS. 5A and 6A, vertical bars, such as vertical bars 501-508 in FIG. 5A, represent a first layer of approximately parallel nanowires, while horizontal bars, such as horizontal bars 509-514 in FIG. 5A, represent a second overlapping layer of approximately parallel horizontal address wires. Nanowires 501-508 have periodic spacing so that the distance between a point on a nanowire and the corresponding point on the next nanowire are identical. The periodic spacing of nanowires is referred to as the "pitch" and is denoted by P. Note that the address wires in both FIGS. 5A and 6A can be of nanoscale, sub-microscale, microscale, or greater dimensions and can be composed of conductor material or semiconductor material. The shaded rectangles, such as shaded rectangle 515 in FIG. 5A, represent electrical components that interconnect address wires with nanowires. The electrical components can be resistors, conductive links, diodes, or FETs, as described above with reference to FIGS. 4A-4F.

FIG. 5A illustrates an exemplary binary-code multiplexer/demultiplexer. In FIG. 5A, a pattern of electrical components is fabricated at selected nanowire junctions. The electrical component pattern ensures that each nanowire is uniquely interconnected with three of the six address wires. For example, electrical components 515-517 interconnect nanowire 507 with address wires 510, 512, and 513, respectively, and no other nanowire is interconnected to all three address wires 510, 512, and 513. A nanowire that receives three high signals via three address wires is said to be "addressed," having a resulting signal that represents the bit value "1." The remaining nanowires are assigned the bit value "0." For example, if address wires 510, 512, and 513 carry high signals, then nanowire 507 is the only nanowire receiving three separate high signals, and, therefore, nanowire 507 carries the bit value "1," while the remaining nanowires carry the bit value "0."

Nanowires 501-508 each have a unique 3-bit binary-code address represented by $A_1A_2A_3$, where $A_1$, $A_2$, and $A_3$ each represents an independent high or low input signal. Input lines 518-520 carry input signals $A_1$, $A_2$, and $A_3$ to address wires 509-514. Note that input lines 518-520 each branch to one pair of address wires. By connecting input lines to branching address wires, a small number of input lines can be used to address a large number of nanowires. For example, in FIG. 5A, three input lines are used to address eight nanowires. Input line 518 branches to the pair of address wires 509 and 510. One address wire at each pair is inverted with respect to the other address wire of the pair. For example, NOT gate 521 inverts input signal $A_1$ to $\overline{A}_1$, carried on address wire 509, while signal $A_1$ is carried on address wire 510.

In FIG. 5A, each nanowire is addressed according to a unique pattern of high and low input signals $A_1$, $A_2$, and $A_3$. The electrical component pattern ensures that no two nanowires have identical addresses by interconnecting each nanowire with a unique set of three address wires. For example, if the input signals $A_1$, $A_2$, and $A_3$ supply high, high, and low signals, respectively, then address wires 510, 512, and 513 carry high signals to nanowire 507 via electrical components 515-517. Nanowire 507 is the only nanowire interconnected with address wires 510, 512, and 513, and, thus, the only nanowire receiving three high signals. The 3-bit binary-code address for nanowire 507 is "110." FIG. 5B shows a table summarizing the 3-bit addresses associated with nanowires 501-508.

FIG. 5C illustrates a cross-sectional view of the multiplexer/demultiplexer shown in FIG. 5A. In FIG. 5C, intermediate layer 522 separates the layer of address wires from the layer of nanowires. Note that the electrical components are aligned and in contact with the nanowires below. For example, electrical component 516, located in intermediate layer 522 at nanowire junction spanning nanowire 507 and address wire 512, is aligned with nanowire 507 and interconnects nanowire 507 and address wire 512.

In general, a binary-code multiplexer/demultiplexer, such as the binary-code multiplexer/demultiplexer shown in FIG. 5A, employs n input lines to uniquely address $2^n$ nanowires. As a result, binary code multiplexer/demultiplexers provide an efficient interface to circuits with many components. For example, the multiplexer/demultiplexer described above with reference to FIG. 5A uses only three external input lines to address eight ($2^3$) nanowires.

FIGS. 6A-6B illustrates an exemplary multiplexer/demultiplexer designed according to an M-bit, N-hot code ("MNH multiplexer/demultiplexer") that employs diode/resistor logic. The number M denotes the total number of address wires as well as the number of bits used to address each nanowire, and the number N denotes the number of M address wires interconnected with each nanowire. For example, in FIG. 6, nanowires 601-606 are each interconnected with two of the four address wires 607-610. Thus each nanowire has a 4-bit 2-hot code address. The electrical component pattern ensures that no two nanowires are interconnected to identical pairs of address wires. For example, electrical components 611 and 612 interconnect nanowire 606 with address wires 609 and 610 and no other nanowire is interconnected to both address wires 609 and 610. The nanowires in an MNH multiplexer/demultiplexer are addressed by passing high signals to the N interconnected address wires. For example, if the input signals $A_1$, $A_2$, $A_3$, and $A_4$ are low, low, high, and high, respectively, then address wires 609 and 610 pass two high signals to electrical components 611 and 612, and, therefore, the input signal low, low, high, and high, or "0011," addresses nanowire 606, the only nanowire interconnected with both address wires 609 and 610. FIG. 6B shows a table summarizing the 4-bit 2-hot code addresses associated nanowires 601-606.

EMBODIMENT OF THE PRESENT INVENTION

Various embodiments of the present invention are described below with reference to multiplexer/demultiplexer nanowire crossbars. However, the present invention is not limited to multiplexer/demultiplexer nanowire crossbars and may be employed to tolerate misalignments in the fabrication on any kind of crossbar array, such as logic arrays, with wires and address wires of any dimension, such as wires used in magnetic circuits and semiconductor-based circuits.

During crossbar array fabrication, one or more of the electrical components may not interconnect certain nanowires and address wires, because of errors in aligning an electrical component pattern with the nanowires. As a result, certain nanowires may not be addressable. Misalignments are more likely to occur between electrical components and nanowires, because the nanowire widths are approximately the same as the electrical-component widths. Electrical components are typically not misaligned with the overlapping address wires, because the address-wire widths are typically much larger than the electrical-component widths. Note that the electrical components represented in the figures described below appear smaller than the width of the nanowires. However, the present invention can be applied to crossbar arrays having electrical components that are smaller than the width of the nanowires or larger than the width of the nanowires.

FIG. 7A illustrates an exemplary nonfunctional, binary-code multiplexer/demultiplexer having electrical components misaligned with nanowires. In FIG. 7A, the electrical components of the electrical component pattern fail to interconnect nanowires with overlapping address wires because the electrical components are not fabricated at nanowire junctions. As a result, the nanowires are not addressable. For example, electrical component 701 does not interconnect nanowire 702 with overlapping address wire 703, because electrical component 701 is not in contact with nanowire 702. In fact, nanowire 702 is not interconnected with any address wire. Nanowire 702 is therefore not addressable. FIG. 7B illustrates a cross-sectional view of the multiplexer/demultiplexer shown in FIG. 7A. The electrical components do not interconnect nanowires with address wire 703. For example, electrical component 701, located in intermediate layer 704, does not interconnect nanowire 702 with address wire 703.

Complete overlap between an electrical component and a nanowire is not necessary to interconnect the nanowires with overlapping address wires. During multiplexer/demultiplexer fabrication, the electrical components may have sufficient contact to interconnect nanowires with overlapping address wires. FIG. 8A illustrates a functional, exemplary binary-code multiplexer/demultiplexer having electrical components that are misaligned with nanowires, but unlike the exemplary multiplexer/demultiplexer shown in FIGS. 7A-7B, the electrical components fabricated at the nanowire junctions have sufficient contact with both the nanowires and overlapping address wires to interconnect the nanowires with the overlapping address wires. For example, in FIG. 8A, electrical component 801, although not completely aligned with nanowire 802, nonetheless interconnects nanowire 802 with overlapping address wire 803. FIG. 8B illustrates a cross-sectional view of the multiplexer/demultiplexer shown in FIG. 8A. The electrical components interconnect the nanowires with overlapping address wire 803. For example, electrical component 801, located in intermediate layer 804, interconnects nanowire 802 with address wire 803.

In one embodiment of the present invention, two or more staggered, redundant electrical component patterns, referred to as "addressing patterns," are employed to establish a sufficient number of interconnections between nanowires and overlapping address wires. In order to increase the likelihood that an addressing pattern is aligned with a desired number of multiplexer/demultiplexer nanowires, the size of the nanowire region may be expanded by increasing the number of nanowires. FIGS. 9A-9B illustrate expansion of a nanowire region of a multiplexer/demultiplexer to accommodate an addressing pattern. FIG. 9A illustrates an addressing-pattern boundary 901, demarcated by solid lines, that is misaligned with nanowire region 902, demarcated by dashed lines. The maximum alignment error, $\Delta x$, is an upper bound on the distance between addressing-pattern center 904 and nanowire-region center 905. In FIG. 9B, nanowire region 902 is expanded by introducing additional nanowires to form expanded nanowire region 906. Note that expanded nanowire region 906 fully accommodates addressing-pattern boundary 901 despite the same maximum alignment error, $\Delta x$, between the electrical component pattern and the nanowire region.

The number of additional nanowires needed to expand a nanowire region can be determined by the following expression:

$$\text{number of additional nanowires} = \frac{\Delta x}{\frac{P}{2}}$$

For example, if a multiplexer/demultiplexer having 128 addressable nanowires with a 60 nm pitch is needed, and the maximum alignment error is 500 nm, then an additional 17 nanowires can be added to give a nanowire region having 145 nanowires that fully covers the nanowire region despite maximum misalignment.

The redundant electrical component patterns of an addressing pattern are staggered so that no two electrical component patterns have the same alignment with the nanowires. As a result, during multiplexer/demultiplexer fabrication, there is a greater likelihood that at least one of the duplicate electrical component patterns is aligned with the nanowires. FIG. 10A illustrates an example addressing pattern that represents one embodiment of the present invention. In FIG. 10A, addressing pattern 1000 is composed of two redundant electrical component patterns identified by dashed-line boxes 1001 and 1002. FIG. 10B illustrates an example alignment of the addressing pattern, shown in FIG. 10A, with respect to three of nanowires 1003-1010. In FIG. 10B, electrical component pattern 1002 is staggered with respect to the location of electrical component pattern 1001 by one-half the pitch. Note that the electrical components of electrical component pattern 1001 are aligned with nanowires 1005-1007, while none of the electrical components of electrical component pattern 1002 are aligned with the nanowires. For example, electrical component 1011 of electrical component pattern 1001 is aligned with nanowire 1005, while electrical component 1012 of electrical component pattern 1002 is not aligned with either nanowire 1005 or nanowire 1006.

A multiplexer/demultiplexer fabricated using an addressing pattern composed of two or more set of electrical component patterns may result in an unknown alignment of the addressing pattern with multiplexer/demultiplexer nanowires. As a result, a large number of nanowire addresses may need to be tested to determine the addresses of the individual nanowires. However, a limited number of representative addressing pattern alignments with multiplexer/demultiplexer nanowires can be determined in advance in order to reduce the number of nanowire addresses needed determine the addresses of the multiplexer/demultiplexer nanowires. The description below and accompanying FIGS. 11-13D, provide an explanation for needing a limited number of representative alignments to determine the unknown addresses of multiplexer/demultiplexer nanowires.

During multiplexer/demultiplexer fabrication, there are an infinite number of alignments an addressing pattern can have with a set of multiplexer/demultiplexer nanowires. However, the infinite number of alignments is repeated with a period equal to the nanowire pitch. FIG. 11 illustrates three of an infinite number of alignments the addressing pattern shown in FIG. 10A can have with respect to a set of nanowires 1101-1108. In FIG. 11, addressing pattern 1000 can have an infinite number of alignments with nanowires 1103-1106 over the range 1109 bounded by dashed-lines 1110 and 1111. Directional arrows 1112-1114 indicate shifting addressing pattern 1000 from boundary 1110 to boundary 1111. Note that the infinite number of possible alignments addressing pattern 1000 can have with a set of nanowires is periodic. For example, addressing pattern 1000 has an infinite number of identical alignments with nanowires 1104-1107.

The infinite number of alignments can be reduced to a finite number of alignments because electrical components do not have to be perfectly aligned with the nanowires to establish interconnections between nanowires and overlapping address wires, as described above with reference to FIGS. 8A-8B. FIGS. 12A-12C illustrate three of infinitely many possible alignments the addressing pattern, shown in FIG. 10B, can have with respect to three nanowires. In FIGS. 12A-12C, directional arrow 1209 identifies a range over which addressing pattern 1000 can have an infinite number of alignments with nanowires 1203-1205. In FIG. 12A, addressing pattern 1000 is against the left boundary of range 1209. In FIG. 12B, addressing pattern 1000 is located in the middle of range 1209. In FIG. 12C, addressing pattern 1000 is against the right boundary of range 1209. Note that all three alignments result in the same electrical components connected to nanowires 1203-1205. As a result, a single addressing pattern alignment, such as the addressing pattern alignment shown in FIG. 12B, can be used to represent all the possible alignments ranging between the alignments shown in FIG. 12A and FIG. 12C. The alignment shown in FIG. 12B is referred to as a "representative alignment."

Figure 13A:
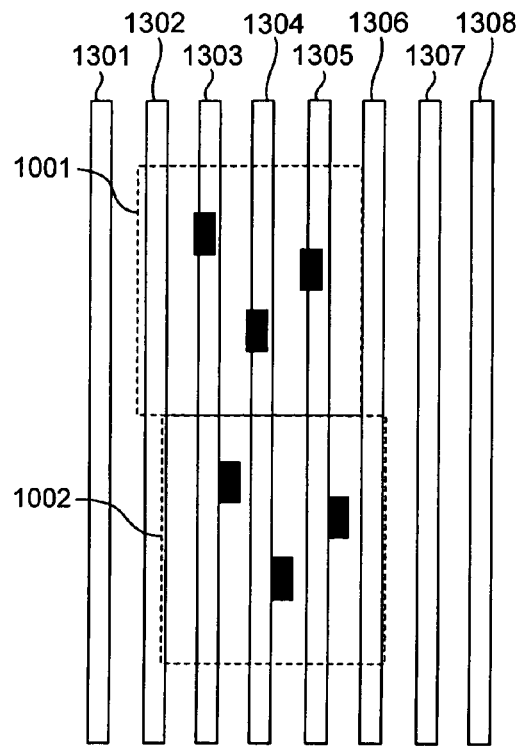
Figure 13B:
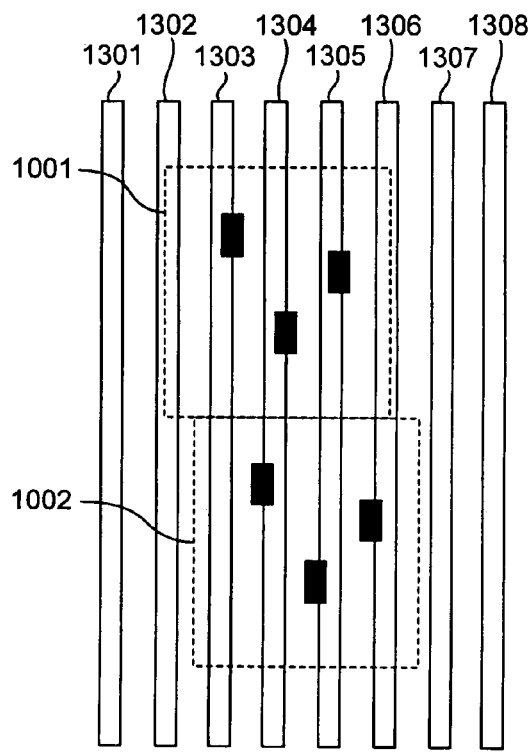
Figure 13C:
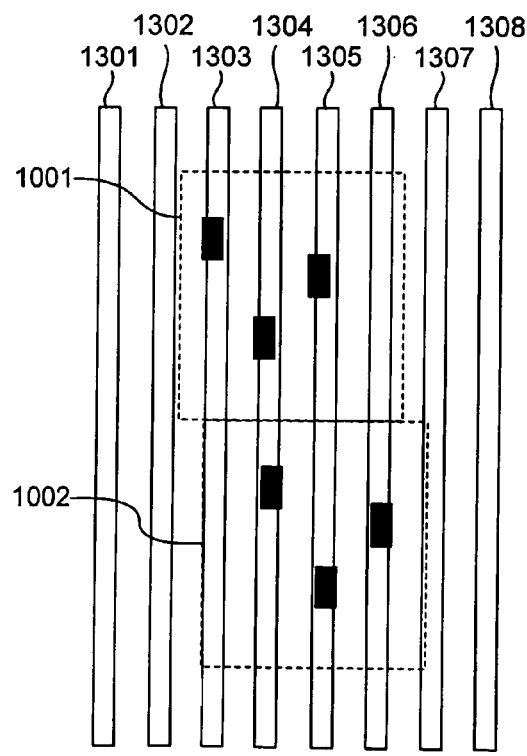
Figure 13D:
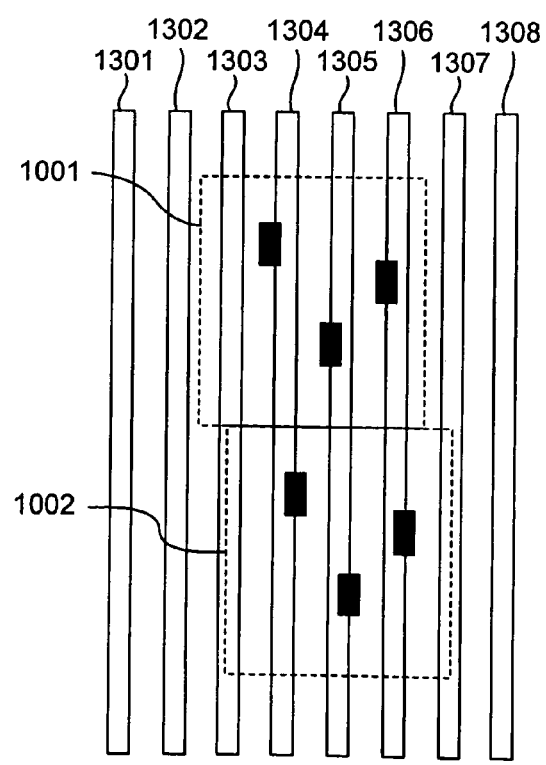

There are at most four representative alignments resulting from the infinitely many possible alignments an addressing pattern can have with respect to a set of nanowires. FIGS. 13A-13D illustrate four representative alignments that the addressing pattern, shown in FIG. 10A, can have with respect to the nanowires. In FIG. 13A, electrical components of electrical component pattern 1001 are aligned with nanowires 1303-1305, while electrical components of electrical component pattern 1002 are not aligned with any of the nanowires. In FIG. 13B, electrical components of electrical component pattern 1001 are aligned with nanowires 1303-1305 and electrical components of electrical component pattern 1002 are aligned with nanowires 1304-1306. In FIG. 13C, none of the electrical components of electrical component pattern 1001 are aligned with the nanowires, while electrical components of electrical components pattern 1002 are aligned with nanowires 1304-1306. In FIG. 13D, electrical components of both electrical component pattern 1001 and electrical component pattern 1002 are aligned with nanowires 1304-1306.

FIGS. 14-18 illustrate a hypothetical application of the present invention to determine a limited number of nanowire addresses that can be used to determine the nanowire addresses of a multiplexer/demultiplexer in accordance with an embodiment of the present invention. FIG. 14 illustrates an example addressing pattern used to fabricate four example representative multiplexer/demultiplexer alignments shown in FIGS. 15-18. In FIG. 14, addressing component pattern 1400 is composed of a first electrical component pattern, identified by dashed-line box 1401 and referred to as set 1, and a second, redundant electrical component pattern, identified by dashed-line box 1402 and referred to as set 2. The relative positions of components within the set 2 electrical component pattern are identical to those in the set 1 electrical component pattern, but the components within the set 2 electrical component pattern are staggered to the right of the set 1 electrical component pattern by one-half the pitch, P/2, of the multiplexer/demultiplexer nanowires, described below in FIGS. 15-18. For example, the electrical components in electrical-component row 1403 of set 1 have an identical electrical-component arrangement and have identical electrical-component spacings as the electrical components in electrical-component row 1404 of set 2, but the electrical components in electrical-component row 1404 are staggered by approximately one-half the pitch to the right of the electrical components in electrical-component row 1403. The degree of staggering, or distance between equivalent electrical components of sets 1 and 2, may vary in various different embodiments.

FIGS. 15-18 illustrate four representative alignments of the addressing pattern shown in FIG. 14 with nanowires of a binary code multiplexer/demultiplexer, each representative alignment an embodiment of the present invention. In FIGS. 15-18, the multiplexer/demultiplexers contain a set of nanowires, such as nanowires 1501-1511 in FIG. 15, a first set of address wires, such as address wires 1512-1517 in FIG. 15, and a second set of address wires, such as address wires 1518-1523 in FIG. 15. Note that, in FIGS. 15-18, the multiplexer/demultiplexer nanowire width is one-half the pitch, P/2, and the electrical component width is approximately one-third the pitch, P/3. The addressing pattern 1400, described above with reference to FIG. 14, provides addresses for eight nanowires. Also note that, by using two sets of address wires and two electrical component patterns, the number of bits needed to address eight nanowires is doubled. For example, rather than using 3-bit addresses to uniquely address each of the eight nanowires, as described above with reference to FIGS. 5A-5B, a 6-bit address is needed to uniquely address each of the eight nanowires.

Figure 15:
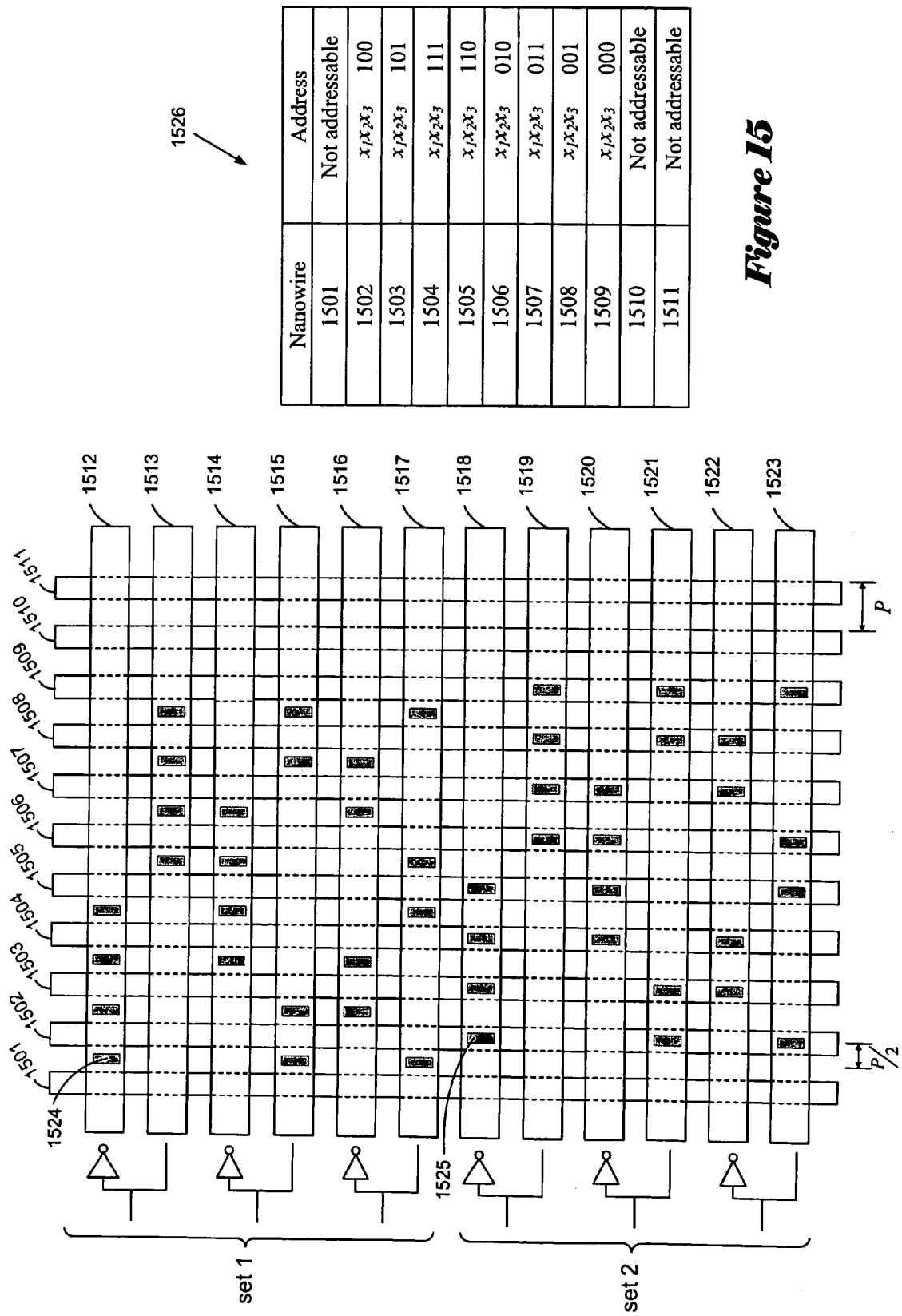

FIG. 15 illustrates a first representative alignment of the addressing-pattern shown in FIG. 14. In FIG. 15, none of the set 1 electrical components interconnect nanowires 1501-1511 with address wires 1512-1517. For example, electrical component 1524 is a set 1 electrical component that does not interconnect address wire 1512 with either nanowire 1501 or nanowire 1502. By contrast, all of the set 2 electrical components interconnect nanowires 1502-1509 with address wires 1518-1523. For example, electrical component 1525 interconnects nanowire 1502 with address wire 1518. As a result, nanowires 1502-1509 are uniquely addressed according to the set 2 electrical component pattern. Note that, because addressing pattern 1400 has a width less than width of the region occupied by nanowires 1501-1511, a certain number of nanowires are not addressable. For example, nanowires 1501, 1510, and 1511 are not addressable. Table 1526 summarizes the 6-bit binary set of addresses of each addressable nanowire. For the addressable nanowires, each 6-bit address includes variables that represent the address wires not interconnected with the nanowires. Variable $x_1$ represents address-wire pair 1512 and 1513, variable $x_2$ represents address-wire pair 1514 and 1515, and variable $x_3$ represents address-wire pair 1516 and 1517. In order to ensure that nanowires 1502-1509 each have a unique 6-bit address, the variables $x_1$, $x_2$, and $x_3$ can be assigned any combination of the bit values "0" and "1." For example, nanowire 1504 can be addressed by any of the following 6-bit addresses: "000 111," "001 111," "010 111," "100 111," "101 111," "110 111," "011 111," or "111 111."

Figure 16:
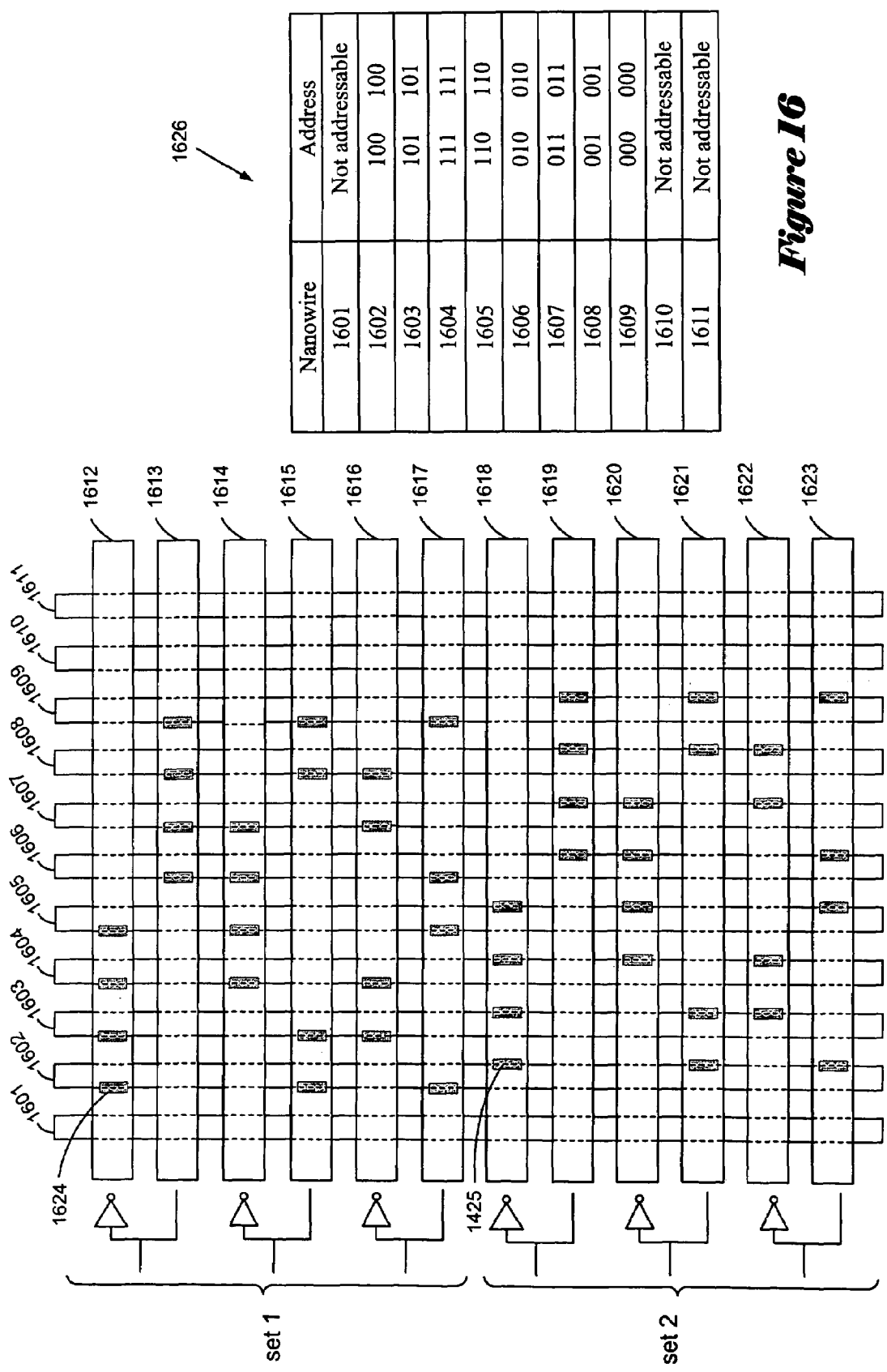

FIG. 16 illustrates a second representative alignment of the addressing-pattern shown in FIG. 14. In FIG. 16, both the set 1 and set 2 electrical components interconnect address wires 1612-1623 with nanowires 1602-1609. For example, electrical component 1624 is a set 1 electrical component that interconnects address wire 1612 with nanowire 1602, and electrical component 1625 is a set 2 electrical component that interconnects address wire 1612 with nanowire 1602. Table 1626 summarizes the set of addresses associated with each addressable nanowire. For example, nanowire 1604 has the 6-bit address "111 111."

FIG. 17 illustrates a third representative alignment of the addressing-pattern shown in FIG. 14. In FIG. 17, the set 1 electrical components interconnect address wires 1712-1717 with nanowires 1702-1709. For example, electrical component 1724 is a set 1 electrical component that interconnects address wire 1712 with nanowire 1702. By contrast, the set 2 electrical components do not interconnect address wires 1718-1723 with nanowires 1701-1711. For example, electrical component 1725 is a set 2 electrical component that does not interconnect address wire 1718 with either nanowire 1702 or nanowire 1703. As a result, the 6-bit addresses associated with nanowires 1702-1709 are determined by the set 1 electrical component pattern. Table 1726 summarizes the set of 6-bit binary-code addresses of each nanowire. Variables $y_1$, $y_2$, and $y_3$ represent pairs of address wires that do not interconnect with the nanowires. The variable $y_1$ represents address-wire pairs 1718 and 1719, variable $y_2$ represents address-wire pairs 1720 and 1721, and variable $y_3$ represents address-wire pairs 1722 and 1723. In order to ensure that nanowires 1702-1709 each have a unique 6-bit address, the variables $y_1$, $y_2$, and $y_3$ can be assigned any combination of the bit values "0" and "1." For example, nanowire 1704 can be addressed by any of the following 6-bit addresses: "111 000," "111 001," "111 010," "111 100," "101 011," "111 101," "111 110," or "111 111."

FIG. 18 illustrates a fourth representative alignment of the addressing-pattern shown in FIG. 14. In FIG. 18, the set 1 and set 2 electrical components interconnect address wires 1812-1823 with nanowires 1802-1810. Note that the placement of the set 1 and set 2 electrical component patterns, shown in FIGS. 15-17, results in addressing of eight of the eleven nanowires. However, the placement of set 1 and set 2 in FIG. 18 allows for the nine nanowires 1802-1810 to be addressed. Table 1824 summarizes a set of 6-bit binary-code addresses of each nanowire. Also note that there are variable bit values for nanowires 1002 and nanowires 1010.

FIG. 19 shows the tables shown in FIGS. 15-18, each table displays a set of addresses that can be used to address nanowires of a hypothetical multiplexer/demultiplexer. Directional arrows 1901 and 1902 indicate that the set of nanowire addresses for nanowires 1602-1609 that can be used to address nanowires 1702-1709 and can be used to address nanowires 1502-1509, because the nanowire addresses in the set of addresses in table 1626 have 3-bit prefixes that match or overlap the 3-bit prefixes in of the addresses displayed in table 1726 and have 3-bit suffixes that match or overlap the 3-bit suffixes of the addresses displayed in table 1526. For example, in table 1626, the 6-bit address of nanowire 1604 can be used to address nanowires 1704 or 1504 because an identical 3-bit pattern occurs in the addresses of nanowires 1704, as a prefix, and 1504, as a suffix. Likewise, directional arrow 1903 indicates that addresses for nanowires 1802-1809 can be used to address nanowires 1702-1709, and directional arrow 1904 indicates that addresses for nanowires 1803-1810 can be used to address nanowires 1502-1509. As a result, the sets of addresses identified in tables 1626 and 1824 can be tested separately to determine the 6-bit addresses of eight nanowires in a multiplexer/demultiplexer that employs the addressing pattern 1400, described above with reference to FIG. 14. For example, the nanowire addresses of a multiplexer/demultiplexer fabricated with addressing pattern 1400, shown in FIG. 14, may be unknown. However, the results described above with reference to FIG. 19 indicate that the nanowire addresses are either the addresses associated with nanowires 1602-1609 in table 1626, the addresses associated with nanowires 1802-1809 in table 1824, or the addresses associated with nanowires 1803-1810 in table 1824. As a result, high and low voltages patterns corresponding to the addresses in tables 1626 and 1824 can be separately applied to the address wires and voltages of the nanowires measured to determine which of the addresses displayed in tables 1626 and 1824 are correct.

The probability of fabricating a multiplexer/demultiplexer having an alignment represented by one of the four addressing-patterns alignments, described above with reference to FIGS. 15-18, depends on the ratio of the nanowire width to the electrical-component width. FIG. 20 illustrates probabilities of fabricating a multiplexer/demultiplexer represented by one of the four representative alignments described above with reference to FIGS. 15-18, for a nanowire width equal to approximately one-half the pitch, and an electrical-component width equal to approximately one-third the pitch. In FIG. 20, and in FIG. 21 described below, the numbers "1," "2," "3," and "4" labeling each wedge represent the representative addressing-patterns alignments described above with reference to FIGS. 15-18, respectively, and the surface area of the disk represents a probability of "1.0." The fraction of the surface area represented by each wedge, in FIGS. 20 and 21, represents the probability of fabricating a particular addressing-pattern alignment represented by one of the four alignments. Wedges 2001 and 2002 are each one-sixth of the total surface area, and wedges 2003 and 2004 are each one-third of the total surface area. Thus the probability of fabricating a multiplexer/demultiplexer having either the addressing-pattern alignments represented by the multiplexer/demultiplexers shown in FIGS. 15 and 17 is approximately one-sixth (0.167), and the probability of fabricating a multiplexer/demultiplexer having either the addressing pattern alignments represented by the multiplexer/demultiplexers shown in FIGS. 16 and 18 is approximately one-third (0.333).

FIG. 21 illustrates the probability of fabricating a multiplexer/demultiplexer represented by one of the four representative alignments, such as the four representative alignments described above with reference to FIGS. 15-18, for a nanowire width and electrical component width equal to approximately one-third the pitch. Wedges 2101 and 2102 are each one-third of the total surface area, and wedges 2103 and 2104 are each one-sixth of the total surface area. Thus the probability of fabricating a multiplexer/demultiplexer having either the addressing-pattern alignments represented by the multiplexer/demultiplexers shown in FIGS. 15 and 17 is approximately one-sixth (0.333), and the probability of fabricating a multiplexer/demultiplexer having either the addressing pattern alignments represented by the multiplexer/demultiplexers shown in FIGS. 16 and 18 is approximately one-third (0.167). Note that by decreasing the width of the nanowires to one-third the pitch, the probability of fabricating the first, second, third, and fourth addressing-patterns is opposite that for fabricating multiplexer/demultiplexers having nanowires widths equal to one-half the pitch, as described above with reference to FIG. 20.

In an alternate embodiment, the present invention can be used to address nanowires for MNH multiplexer/demultiplexers. FIG. 22 illustrates an example addressing pattern used to fabricate four exemplary representative multiplexer/demultiplexer alignments shown in FIGS. 23-26. In FIG. 22, addressing component pattern 2200 is composed of a first electrical component pattern, identified by dashed-line box 2201 and referred to as set 3, and a second, redundant electrical component pattern, identified by dashed-line box 2202 and referred to as set 4. The set 4 electrical component pattern is staggered to the right of the set 3 electrical component pattern by one-half the nanowire pitch, P/2, of the described below in FIGS. 23-26. Note that the degree of staggering, or distance between equivalent electrical components of sets 3 and 4, may vary in various different embodiments.

FIGS. 23-26 illustrate four representative alignments of the addressing pattern shown in FIG. 22 with nanowires of an MNH multiplexer/demultiplexer, each representative addressing-pattern alignment representing an embodiment of the present invention. In FIGS. 23-26, the two staggered redundant electrical component patterns are labeled set 3 and set 4.

Figure 23:
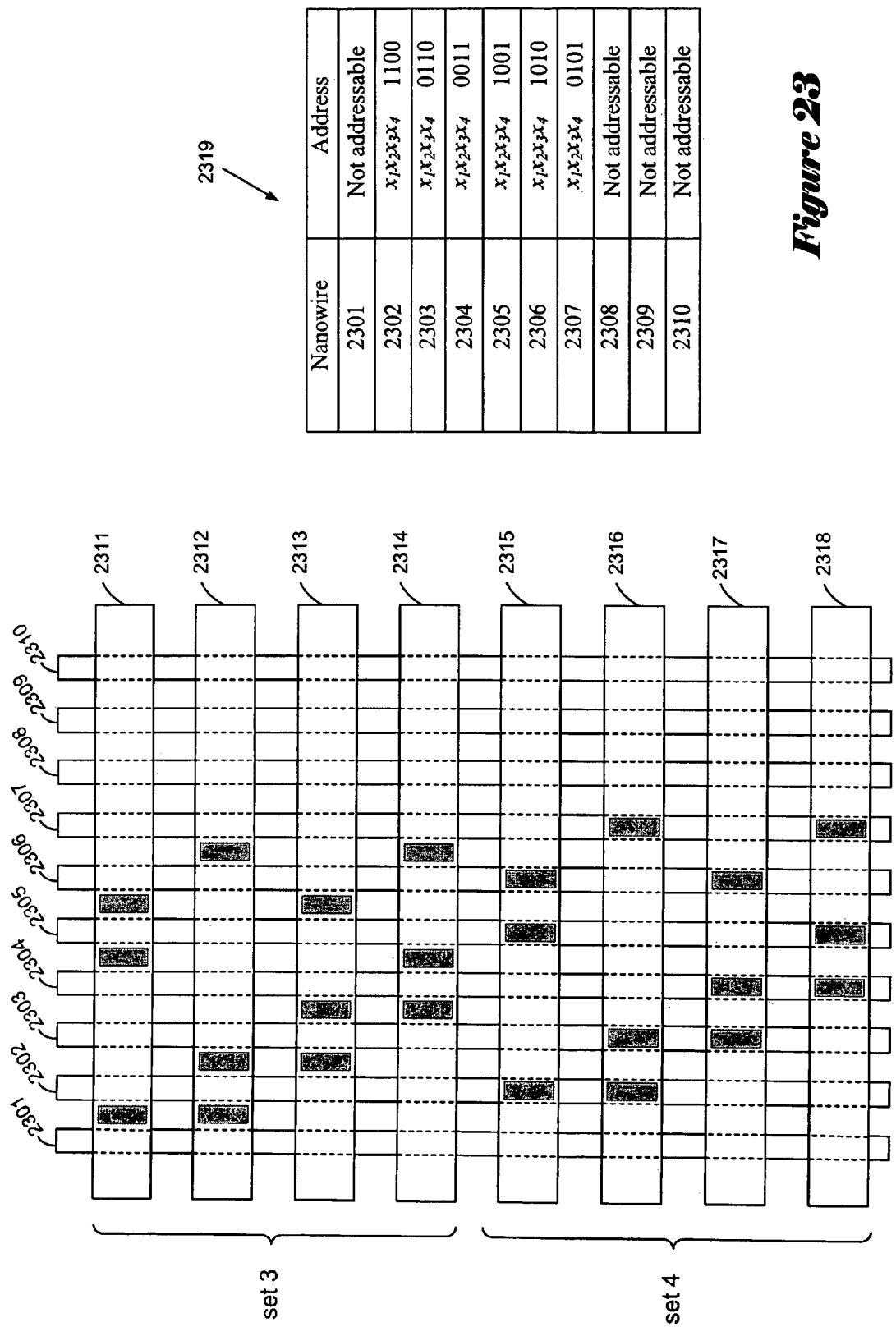

FIG. 23 illustrates a first representative addressing-pattern alignment of the set 3 and set 4 electrical component patterns with nanowires of a multiplexer/demultiplexer. The set 3 electrical-components do not interconnect address wires 2311-2314 with nanowires 2301-2310, and the set 4 electrical-components do interconnect address wires 2315-2318 with nanowires 2302-2307. Table 2319 summarizes the 8-bit 4-hot code set of addresses associated with each addressable nanowire. The variables $x_1$, $x_2$, $x_3$, and $x_4$ correspond to unconnected address wires 2311-2314, respectively. For example, nanowire 2304 can be addressed by any one of the following addresses: "0011 0011," "0110 0011," "1100 0011," "0101 0011," "1010 0011," and "1001 0011." Note that because the number of nanowires available for addressing is greater than the number of uniquely addressed nanowires needed, a certain number of nanowires are unaddressable nanowires. For example, nanowires 2301, 2308-2310 are unaddressable nanowires.

Figure 24:
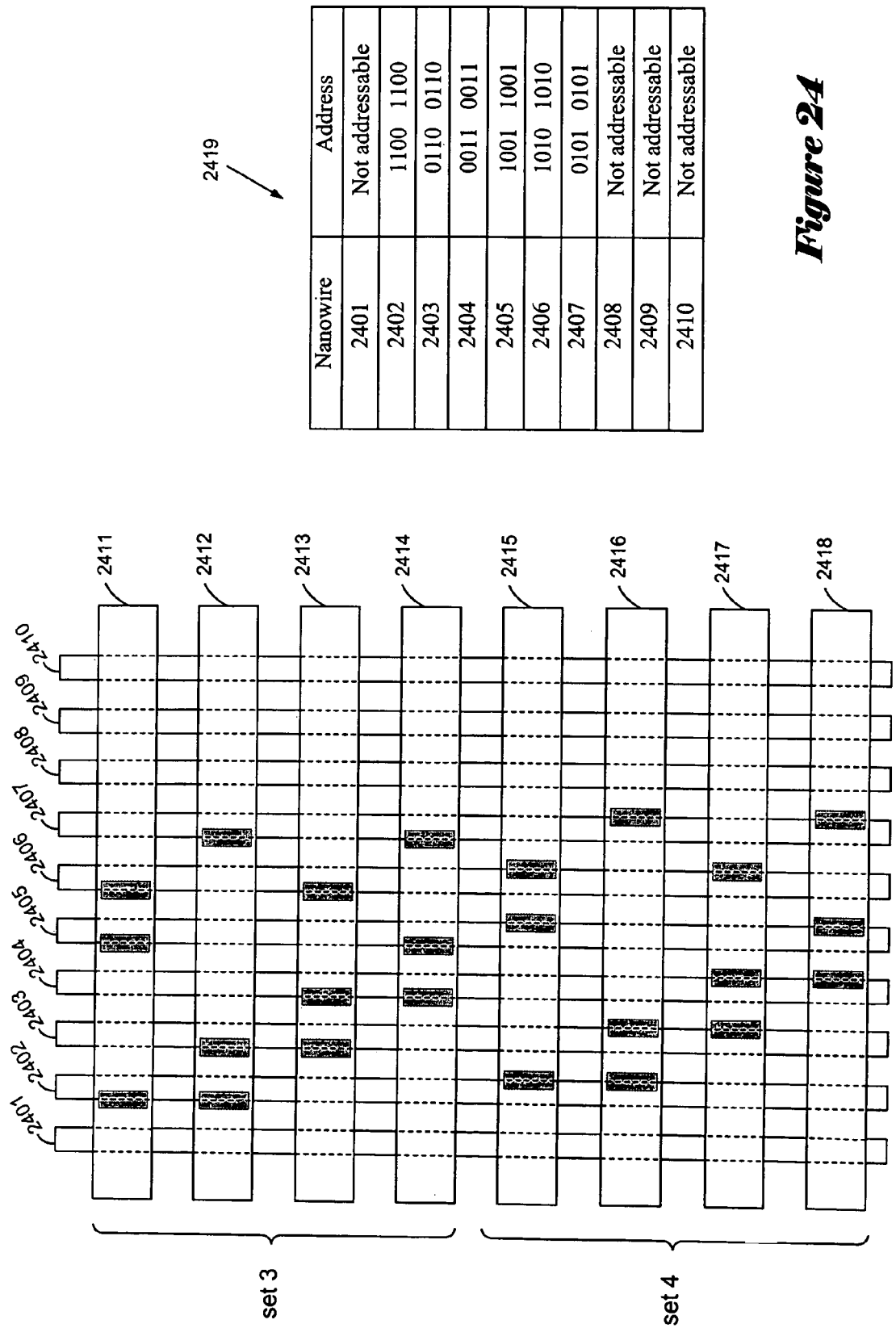

FIG. 24 illustrates a second representative addressing-pattern alignment of the set 3 and set 4 electrical component patterns with nanowires of a multiplexer/demultiplexer. Both of the set 3 and set 4 electrical-components interconnect address wires 2411-2418 with nanowires 2402-2407. Table 2419 summarizes the set of 8-bit 4-hot code addresses.

FIG. 25 illustrates a third representative addressing pattern alignment of the set 3 and set 4 electrical component patterns with nanowires of a multiplexer/demultiplexer. The set 3 electrical-components interconnect nanowires 2502-2507 with address wires 2511-2514, and the set 4 electrical-components does not interconnect address wires 2515-2518 with any of the nanowires. Table 2519 summarizes the 8-bit 4-hot code set of addresses associated with nanowires 2502-2507. The variables $y_1$, $y_2$, $y_3$, and $y_4$ are substituted for the bits that represent unconnected address wires 2511-2514, respectively. For example, nanowire 2505 can be addressed by any one of the following addresses: "1001 0011," "1001 0110," "1001 1100," "1001 0101," "1001 1010," and "1001 1001."

FIG. 26 illustrates a fourth representative addressing-pattern alignment of the set 3 and set 4 electrical component patterns with nanowires of a multiplexer/demultiplexer. The set 3 and set 4 electrical-components interconnect address wires 2611-2618 with the nanowires 2602-2608. Table 2619 summarizes the 8-bit 4-hot code set of addresses for addressable nanowires 2602-2608.

FIG. 27 shows the tables of 8-bit addresses shown in FIGS. 23-26 that can be used to address nanowires of a hypothetical multiplexer/demultiplexer. Directional arrows 2701 and 2702 indicate that the nanowire addresses for nanowires 2402-2407 can be used to address nanowires 2502-2507 and can be used to address nanowires 2302-2307. For example, in table 2419, the 8-bit address of nanowire 2404 can be used to address nanowires 2504 or 2304 because the 8-bit address of nanowire 2404 has an identical 4-bit prefix as nanowire 2504 and an identical 4-bit suffix as nanowire 2304. Likewise, directional arrow 2703 indicates that addresses of nanowires 2602-2607 can be used to address nanowires 2502-2507, and directional arrow 2704 indicates that addresses for nanowires 2603-2608 can be used to address nanowires 2302-2307. As a result, fabricating a multiplexer/demultiplexer, as described above with reference to FIGS. 23-26, indicates that only two set of addresses are need to determine the 8-bit addresses for eight of the nanowires.

Although the present invention has been described in terms of particular embodiments, it is not intended that the invention be limited to these embodiments. Modifications within the spirit of the invention will be apparent to those skilled in the art. For example, in an alternate embodiment, two or more electrical component patterns composing an addressing pattern may have different electrical-components arrangements. In an alternate embodiment, a random distribution of electrical components may be used to fabricate the two or more staggered, redundant electrical component patterns comprising an addressing pattern.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

What is claimed is:

1. A device that interfaces wires to address wires, the device comprising:

a first layer of two or more approximately parallel wires;

a second layer of two or more approximately parallel address wires that overlays the first layer;

an intermediate layer positioned between the first layer and the second layer; and two or more redundant electrical component patterns fabricated within the intermediate layer so that one or more of the electrical component patterns is aligned with the first and second layers.

2. The device of claim 1 wherein the approximately parallel address wires that overlays the first layer of two or more approximately parallel wires is roughly perpendicular to the wires in the first layer.

3. The device of claim 1 wherein the two or more patterns of electrical-components further comprises different arrangements of the electrical components for each of the electrical component patterns.

4. The device of claim 1 wherein the two or more electrical component patterns further comprises randomly distributed electrical components for each of the electrical component patterns.

5. The device of claim 1 wherein the number of one or more approximately parallel wires is increased by:

$$\text{number of additional wires} = \frac{\Delta x}{\frac{P}{2}}$$

where $\Delta x$ is addressing pattern capacity; and

P is the wire pitch.

6. The device of claim 1 wherein the one or more approximately parallel wires can be nanoscale, sub-microscale, microscale, or greater dimensional wires and can be composed of conductor material or semiconductor material.

7. The device of claim 1 wherein the address wires can be nanoscale, sub-microscale, microscale, or greater dimensional wires and can be composed of conductor material or semiconductor material.

8. The device of claim 1 wherein one or more of the two or more electrical component patterns interconnects one or more of the address wires to one or more of the wires.

* * * * *